(12) United States Patent
Matsudai et al.

(10) Patent No.: US 9,214,535 B2
(45) Date of Patent: Dec. 15, 2015

(54) SEMICONDUCTOR DEVICE

(71) Applicant: KABUSHIKI KAISHA TOSHIBA, Minato-ku (JP)

(72) Inventors: Tomoko Matsudai, Tokyo (JP); Tsuneo Ogura, Kamakura (JP); Kazutoshi Nakamura, Himeji (JP); Yuichi Oshino, Fuchu (JP); Hideaki Ninomiya, Himeji (JP); Yoshiko Ikeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 14/023,357

(22) Filed: Sep. 10, 2013

(65) Prior Publication Data
US 2014/0084337 A1 Mar. 27, 2014

(30) Foreign Application Priority Data

Sep. 24, 2012 (JP) ................................. 2012-210232
Oct. 24, 2012 (JP) ................................. 2012-235176
May 24, 2013 (JP) ................................. 2013-110412

(51) Int. Cl.
*H01L 29/739* (2006.01)
*H01L 29/36* (2006.01)
*H01L 29/66* (2006.01)
*H01L 29/06* (2006.01)

(52) U.S. Cl.
CPC ........ *H01L 29/7393* (2013.01); *H01L 29/0696* (2013.01); *H01L 29/36* (2013.01); *H01L 29/66348* (2013.01); *H01L 29/7397* (2013.01)

(58) Field of Classification Search
CPC ..... H01L 29/739; H01L 29/74; H01L 29/423; H01L 29/66; H01L 27/06; H01L 27/07; H01L 27/082; H01L 29/78; H01L 29/7811; H01L 29/4236; H01L 27/0664; H01L 21/306
USPC .......... 257/140, 139, 133, 565, 368, 369, 370
See application file for complete search history.

(56) References Cited

U.S. PATENT DOCUMENTS

| | | | |
|---|---|---|---|
| 7,456,484 B2 | 11/2008 | Ozeki et al. | |
| 8,168,999 B2 | 5/2012 | Tzuzuki et al. | |
| 2007/0200138 A1* | 8/2007 | Ozeki et al. | 257/139 |
| 2008/0048295 A1* | 2/2008 | Takahashi | 257/565 |
| 2009/0289276 A1* | 11/2009 | Yoshiura et al. | 257/133 |
| 2011/0186965 A1 | 8/2011 | Nemoto et al. | |
| 2011/0220961 A1 | 9/2011 | Ninomiya | |
| 2012/0043581 A1 | 2/2012 | Koyama et al. | |
| 2013/0087829 A1 | 4/2013 | Tanabe et al. | |

FOREIGN PATENT DOCUMENTS

| | | |
|---|---|---|
| JP | 2003-218354 A | 7/2003 |
| JP | 2008-042073 A | 2/2008 |

(Continued)

*Primary Examiner* — Chuong A Luu
(74) *Attorney, Agent, or Firm* — White & Case LLP

(57) ABSTRACT

A collector layer of a first conductivity type is provided in the IGBT region and the boundary region and functions as a collector of the IGBT in the IGBT region. A cathode layer of a second conductivity type is provided in the diode region apart from the collector layer and functions as a cathode of the diode. A drift layer of the second conductivity type is provided in the IGBT region, the boundary region, and the diode region, the drift layer being provided on sides of the collector layer and the cathode layer opposite the first electrode. A diffusion layer of the first conductivity type is provided in the boundary region on a side of the drift layer opposite the first electrode.

10 Claims, 26 Drawing Sheets

(56) References Cited

FOREIGN PATENT DOCUMENTS

| | | |
|---|---|---|
| JP | 2008-192737 A | 8/2008 |
| JP | 2009-111188 A | 5/2009 |
| JP | 2009-158922 A | 7/2009 |
| JP | 2011-134950 A | 7/2011 |
| JP | 2011-238681 A | 11/2011 |
| JP | 2013-080796 A | 5/2013 |

* cited by examiner

SEMICONDUCTOR DEVICE

CROSS REFERENCE TO RELATED APPLICATIONS

This application is based on and claims the benefit of priority from prior Japanese Patent Application No. 2012-210232, filed on Sep. 24, 2012, prior Japanese Patent Application No. 2012-235176, filed on Oct. 24, 2012, and prior Japanese Patent Application No. 2013-110412, filed on May 24, 2013, the entire contents of which are incorporated herein by reference.

FIELD

This embodiment relates to a semiconductor device.

BACKGROUND

A Reverse-Conducting IGBT (RC-IGBT) has recently been actively developed. The RC-IGBT has an insulated gate bipolar transistor (IGBT) and a diode formed on the same substrate and has the characteristics of the both. Unfortunately, a problem may arise that in a region of the RC-IGBT where the diode and the IGBT are adjacent, the adjacent diode and IGBT cause an unintended parasitic PNP transistor in the diode region, which causes a malfunction and characteristics failure or the like.

When manufacturing of RC-IGBTs is taken into consideration, it is important to improve the characteristics of the IGBT as well as to improve the characteristics of the diode that is to be integrated.

DETAILED DESCRIPTION

Figure 1:
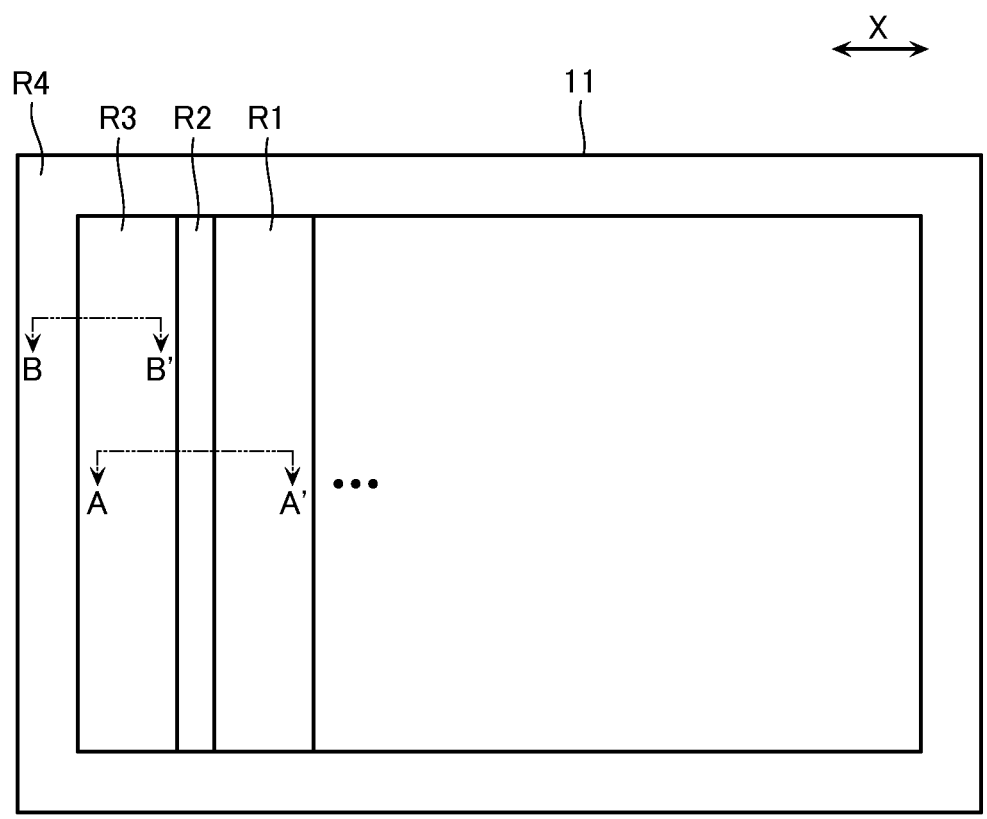
FIG. 1 is a schematic top view of a semiconductor device according to a first embodiment.

The semiconductor devices according to the embodiments described below each comprise an IGBT region, a diode region, and a boundary region. The IGBT region is provided on a first electrode and functions as an IGBT. The diode region is provided on the first electrode and functions as a diode. The boundary region is provided between the IGBT region and the diode region and adjacent to the IGBT region and the diode region. In addition, the semiconductor device comprises a collector layer of a first conductivity type, a cathode layer of a second conductivity type, a drift layer of the second conductivity type, and a diffusion layer of the first conductivity type. The collector layer is provided in the IGBT region and the boundary region on a first surface side of the first electrode. The collector layer functions as a collector of the IGBT in the IGBT region. The cathode layer is apart from the collector layer and provided in the diode region on the first surface side of the first electrode. The cathode layer functions as a cathode of the diode. The drift layer is provided in the IGBT region, the boundary region, and the diode region on the sides of the collector layer and the cathode layer opposite the first electrode. The diffusion layer is provided in the boundary region on the side of the drift layer opposite the first electrode.

Referring now to the drawings, the semiconductor devices according to the embodiments will be described below.

First Embodiment

Referring first to FIG. 1, a schematic configuration of a semiconductor device according to a first embodiment will be described. FIG. 1 is a schematic top view of the semiconductor device according to the first embodiment. With reference to FIG. 1, the semiconductor device according to the first embodiment comprises, on a semiconductor substrate 11, an IGBT region R1, a boundary region R2, a diode region R3, and a terminal region R4. The IGBT region R1 functions as an insulated gate bipolar transistor (IGBT). The diode region R3 functions as a diode. The boundary region R2 is provided between the IGBT region R1 and the diode region R3 and adjacent to the IGBT region R1 and the diode region R3 in the X direction. The terminal region R4 is adjacent to the diode region R3 in the X direction and positioned at the termination of the semiconductor substrate 11. Note that the X direction is a direction parallel to the semiconductor substrate 11. In addition, the terminal region R4 and the IGBT region R1 may be adjacent in the X direction.

Figure 2:
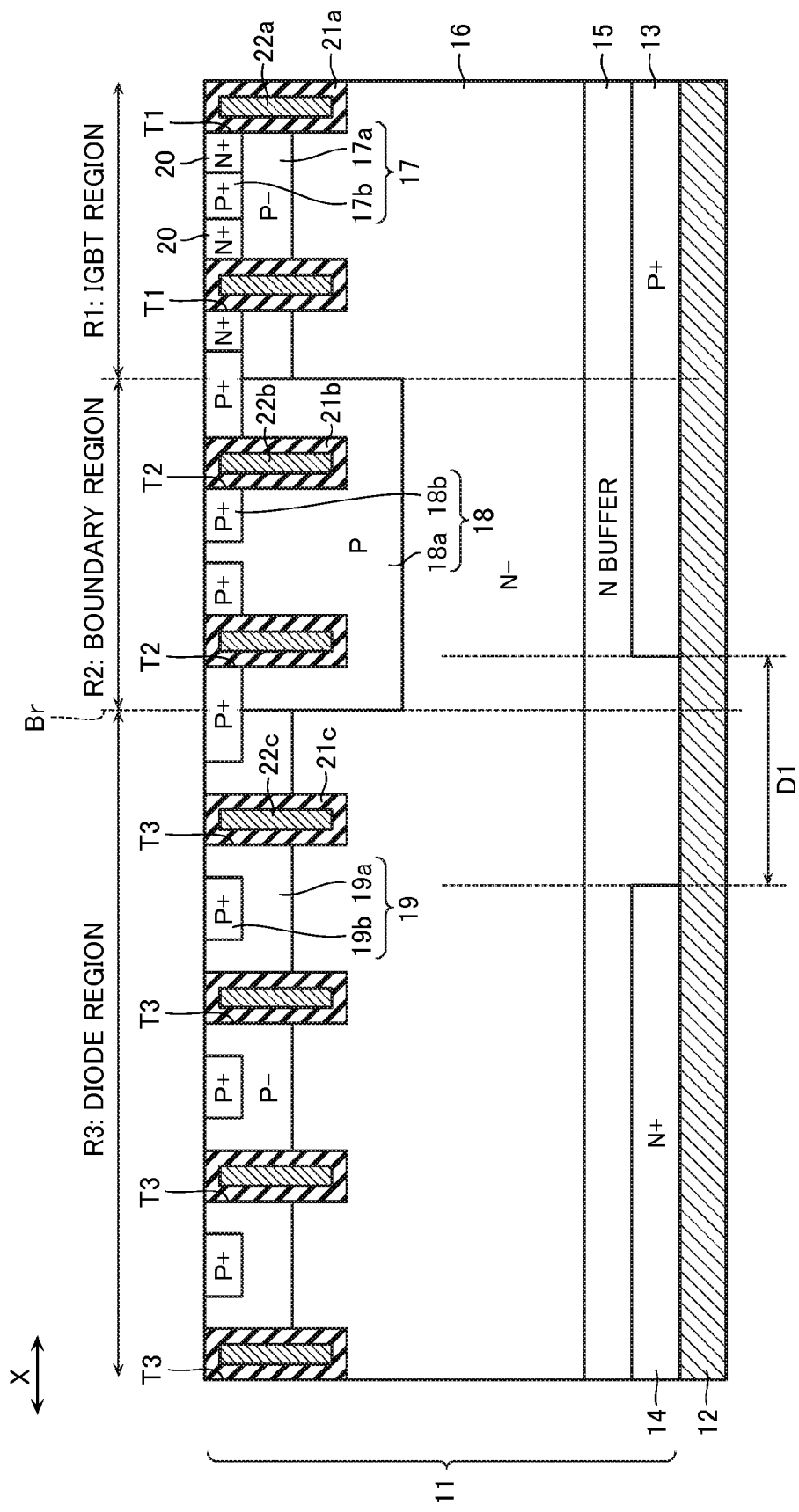
FIG. 2 is the A-A' cross-sectional view in FIG. 1 illustrating the semiconductor device according to the first embodiment.

Referring now to FIG. 2, a specific structure of the semiconductor device will be described. FIG. 2 is the A-A' cross-sectional view in FIG. 1. With reference to FIG. 2, the semiconductor device according to the first embodiment comprises a common electrode 12, which is in contact with the back surface of the semiconductor substrate 11, as well as a collector layer 13, a cathode layer 14, a buffer layer 15, and a drift layer 16, which are provided in the semiconductor substrate 11.

The common electrode 12 functions as a collector electrode of the IGBT in the IGBT region R1 and functions as a cathode electrode of the diode in the diode region R3. The common electrode 12 extends in the IGBT region R1, the boundary region R2, and the diode region R3.

The collector layer 13 functions as a collector of the IGBT. The collector layer 13 is in contact with the upper surface of the common electrode 12 in the IGBT region R1 and the boundary region R2. The collector layer 13 comprises a P+ type semiconductor. It is assumed below that in this embodiment, a P− type semiconductor has a lower impurity concentration than a P type semiconductor and the P+ type semiconductor has a higher impurity concentration than a P type semiconductor. Likewise, it is assumed that an N− type semiconductor has a lower impurity concentration than an N type semiconductor and an N+ type semiconductor has a higher impurity concentration than an N type semiconductor.

The cathode layer 14 functions as a cathode of the diode. The cathode layer 14 is provided in the diode region R3. The cathode layer 14 is formed on the diode region R3 side of the boundary Br between the boundary region R2 and the diode region R3. Meanwhile, the collector layer 13 is formed in the IGBT region R1 and in a portion of the boundary region R2 (the collector layer 13 is not formed at the boundary Br between the boundary region R2 and the diode region R3). Therefore, the cathode layer 14 and the collector layer 13 are spaced apart at a predetermined distance D1 and in contact with the upper surface of the common electrode 12. The cathode layer 14 comprises an N+ type semiconductor. The cathode layer 14 formed on the diode region R3 side of the boundary Br may reduce the operation of an anode-high-injection diode formed by a diffusion layer 18, the drift layer 16, the buffer layer 15, and the cathode layer 14. In addition, the collector layer 13 having its end in the boundary region R2 may reduce the operation of a parasitic PNP transistor formed by an anode layer 19, the drift layer 16, the buffer layer 15, and the collector layer 13, thus preventing a malfunction of the entire semiconductor device.

The buffer layer 15 is in contact with the upper surface of the collector layer 13 in the IGBT region R1 and the boundary region R2, and also in contact with the upper surfaces of the cathode layer 14 and the common electrode 12 in the diode region R3. The buffer layer 15 comprises an N type semiconductor.

The drift layer 16 is in contact with the upper surface of the buffer layer 15 in the IGBT region R1, the boundary region R2, and the diode region R3. The drift layer 16 comprises an N− type semiconductor.

In addition, with reference to FIG. 2, the semiconductor device comprises a body layer 17, the diffusion layer 18, the anode layer 19, and an emitter layer 20, which are all provided in the semiconductor substrate 11.

The body layer 17 is in contact with the upper surface of the drift layer 16 in the IGBT region R1. The body layer 17 comprises a low concentration body layer 17a and a high concentration body layer 17b. The low concentration body layer 17a is in contact with the upper surface of the drift layer 16 and comprises a P− type semiconductor. The high concentration body layer 17b is in contact with the upper surface of the low concentration body layer 17a, and is repeatedly provided at a predetermined pitch in the X direction. The high concentration body layer 17b comprises a P+ type semiconductor.

The diffusion layer 18 is provided to prevent the breakdown voltage degradation in the boundary region R2. The diffusion layer 18 is in contact with the upper surface of the drift layer 16 in the boundary region R2. The diffusion layer 18 comprises a diffusion layer 18a and a high concentration diffusion layer 18b. The diffusion layer 18a is in contact with the upper surface of the drift layer 16 and comprises a P type semiconductor. In addition, the diffusion layer 18a is formed at a position deeper than the body layer 17. The high concentration diffusion layer 18b is in contact with the upper surface of the diffusion layer 18a and is repeatedly provided at a predetermined pitch in the X direction. The high concentration diffusion layer 18b comprises a P+ type semiconductor.

The anode layer 19 functions as an anode of the diode. The anode layer 19 is in contact with the upper surface of the drift layer 16 in the diode region R3. The anode layer 19 comprises a low concentration anode layer 19a and a high concentration anode layer 19b. The low concentration anode layer 19a is in contact with the upper surface of the drift layer 16 and comprises a P− type semiconductor. The high concentration anode layer 19b is in contact with the upper surface of the low concentration anode layer 19a and is repeatedly provided at a predetermined pitch in the X direction. The high concentration anode layer 19b comprises a P+ type semiconductor. Note that although FIG. 2 shows that the high concentration anode layer 19b has a shallower junction depth than the low concentration anode layer 19a, it may also be possible that, conversely, the high concentration anode layer 19b has a deeper junction depth than the low concentration anode layer 19a. Further, an anode electrode (not shown) is formed in contact with the anode layer 19.

The emitter layer 20 functions as an emitter of the IGBT. The emitter layer 20 is in contact with, in the IGBT region R1, the upper surface of the low concentration body layer 17a and the side surfaces of the high concentration body layer 17b. The emitter layer 20 comprises an N+ type semiconductor. The emitter electrode (not shown) is formed in contact with the emitter layer 20 and the high concentration body layer 17b.

In addition, with reference to FIG. 2, this embodiment comprises trenches T1 to T3 formed in the surface of the semiconductor substrate 11, and the trenches T1 to T3 comprise therein insulating layers 21a to 21c and conductive layers 22a to 22c, respectively.

The trenches T1 to T3 are repeatedly provided at a predetermined pitch in the X direction. The trench T1 is formed, in the IGBT region R1, passing through the emitter layer 20 and body layer 17 into the drift layer 16. The trench T2 is formed, in the boundary region R2, passing through the high concentration diffusion layer 18b into the diffusion layer 18a. The trench T3 is formed, in the diode region R3, passing through the low concentration anode layer 19a into the drift layer 16.

The insulating layers 21a to 21c are formed to predetermined thicknesses on the respective surfaces of the trenches T1 to T3. The insulating layers 21a to 21c comprise, for example, silicon dioxide. The conductive layer 22a functions as a gate of the IGBT. The conductive layer 22c is connected to the anode electrode of the diode. The conductive layers 22a to 22c fill the trenches T1 to T3 via the insulating layers 21a to 21c, respectively. The conductive layers 22a to 22c comprise, for example, polysilicon.

The effects from the above configuration according to the first embodiment will now be described. It is now assumed that unlike FIG. 2, the cathode layer 14 is formed protruding into the boundary region R2. Then, the diffusion layer 18, the drift layer 16, the buffer layer 15, and the cathode layer 14 together form the anode-high-injection diode. In addition, it is now assumed that unlike FIG. 2, the collector layer 13 is formed protruding into the diode region R3. Then, the anode layer 19, the drift layer 16, the buffer layer 15, and the collector layer 13 together form the parasitic PNP transistor, which may cause a malfunction or the like. In view thereof, therefore, in the first embodiment, the cathode layer 14 is formed on the diode region R3 side of the boundary Br. Meanwhile, the collector layer 13 is formed in the IGBT region R1 and in a portion of the boundary region R2. Thus, the cathode layer 14 and the collector layer 13 are apart by a predetermined distance D1, and in contact with the upper surface of the common electrode 12. Therefore, the first embodiment may reduce the generation of the anode-high-injection diode and the parasitic PNP transistor described above, thus reducing a malfunction or the like.

Second Embodiment

Figure 3:
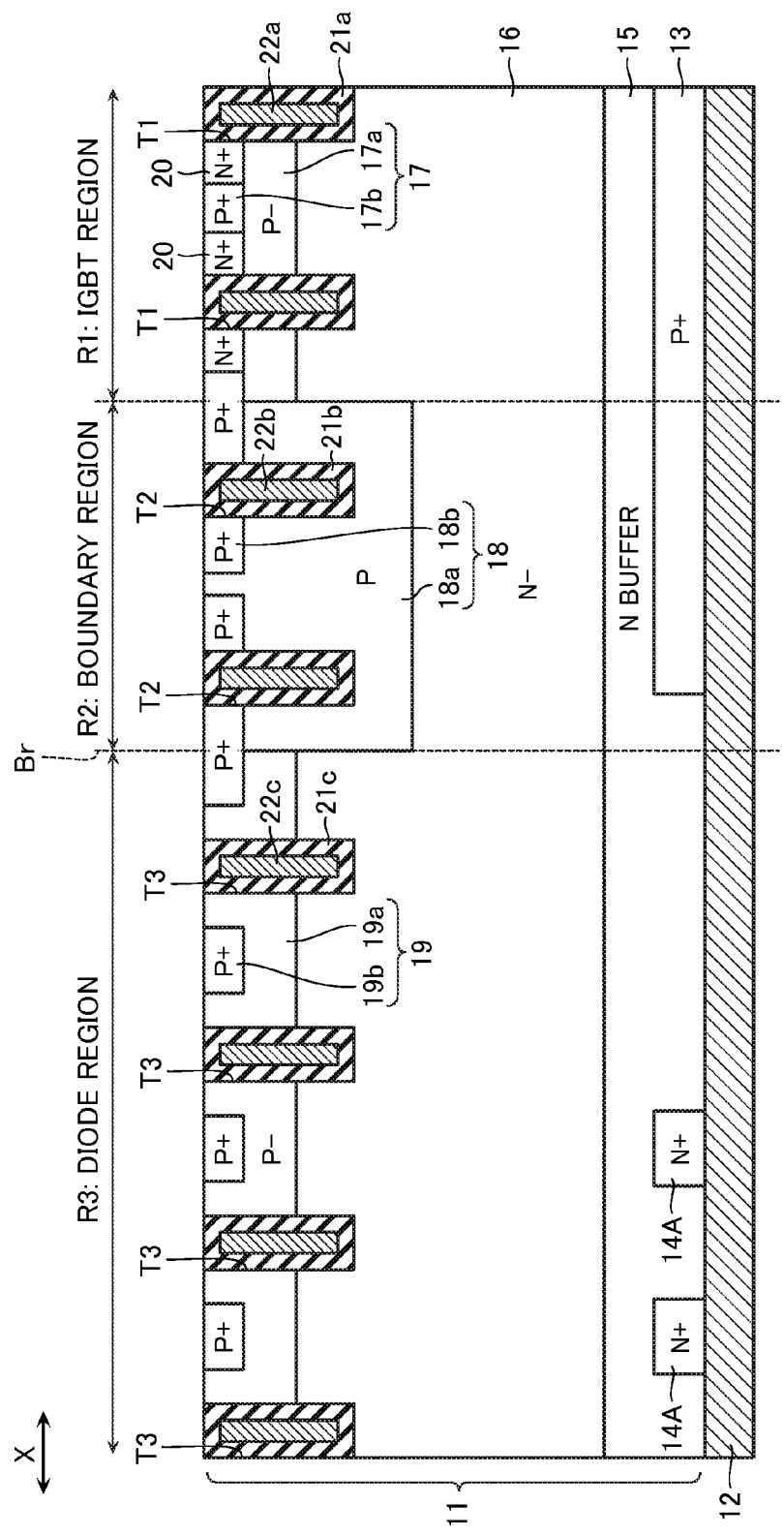
FIG. 3 is the A-A' cross-sectional view in FIG. 1 illustrating a semiconductor device according to a second embodiment.

Referring now to FIG. 3, a semiconductor device according to a second embodiment will be described. FIG. 3 is the A-A' cross-sectional view in FIG. 1 illustrating the semiconductor device according to the second embodiment. With reference to FIG. 3, the second embodiment comprises, like the first embodiment, the IGBT region R1 and the boundary region R2. In addition, with reference to FIG. 3, the second embodiment comprises, like the first embodiment, a cathode layer 14A in the diode region R3, the cathode layer 14A being apart from the collector layer 13. Note that the cathode layer 14A is repeatedly provided at a predetermined pitch in the X direction. In this regard, the cathode layer 14A is different from the cathode layer 14 in the first embodiment. In the second embodiment, the other components are generally the same as those in the first embodiment and accordingly they are designated with like reference numerals and their detailed description is omitted here.

Also in the second embodiment, like the first embodiment, the cathode layer 14A is formed on the diode region R3 side of the boundary Br between the boundary region R2 and the diode region R3. The collector layer 13 is formed in the IGBT region R1 and in a portion of the boundary region R2. Therefore, the second embodiment may reduce the generation of the anode-high-injection diode and the parasitic PNP transistor, thus reducing a malfunction or the like. In addition, in the second embodiment, the cathode layer 14A that is repeatedly provided at a predetermined pitch in the X direction may reduce the total impurity amount of the cathode of the diode. This may reduce the injection of carriers from the cathode and provide a low injection cathode, thus achieving a high speed and a low loss in the recovery characteristics of the diode. Further, in the second embodiment, the repeat pitch width, the occupancy rate, and the like of the high concentration anode layer 19b and the cathode layer 14A may be adjusted to provide a low injection of both the anode and cathode, thus providing good recovery characteristics without necessity of the life time control.

Third Embodiment

Figure 4:
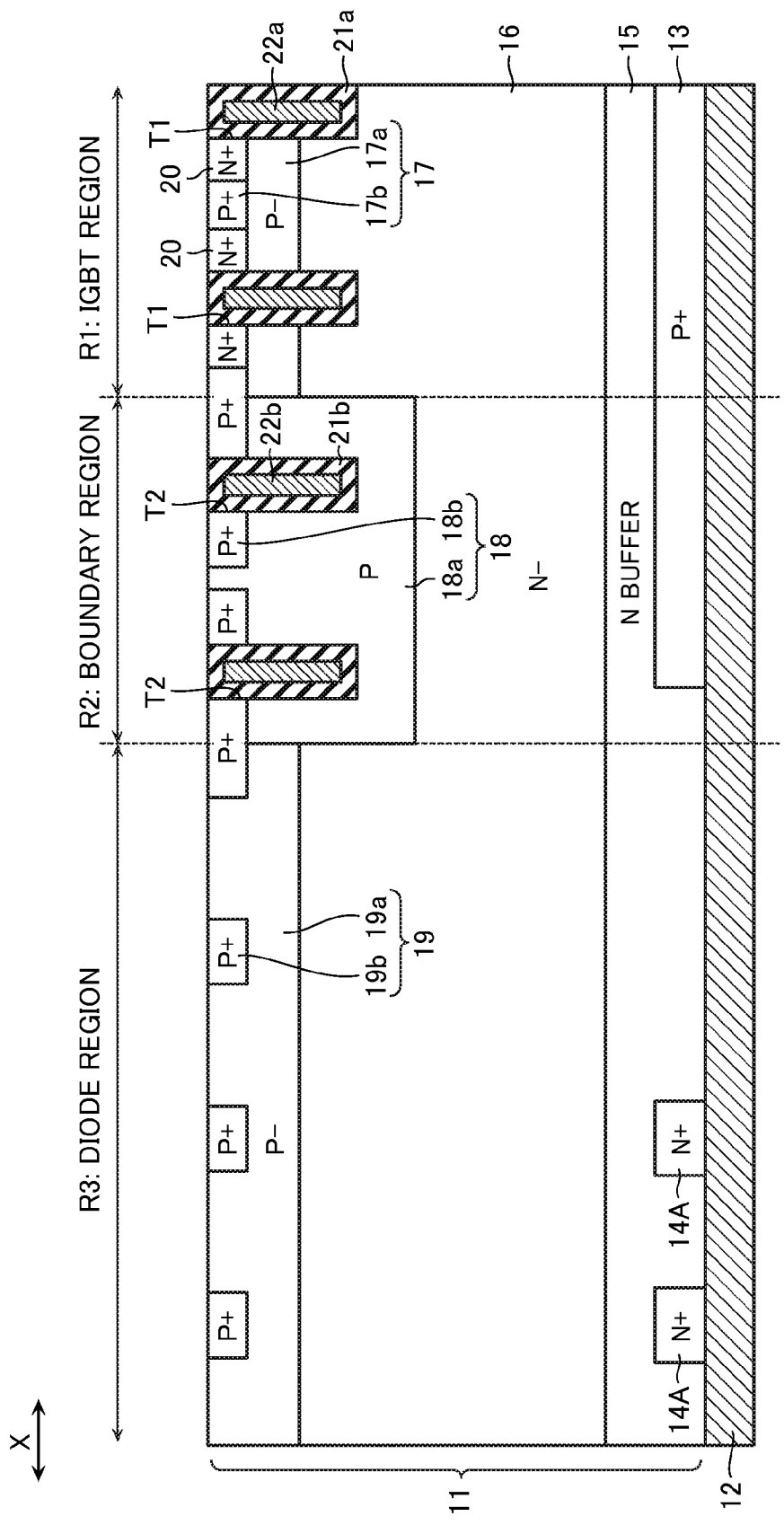
FIG. 4 is the A-A' cross-sectional view in FIG. 1 illustrating a semiconductor device according to a third embodiment.

Referring now to FIG. 4, a semiconductor device according to a third embodiment will be described. FIG. 4 is the A-A' cross-sectional view in FIG. 1 illustrating the semiconductor device according to the third embodiment. With reference to FIG. 4, the third embodiment comprises, like the first embodiment, the IGBT region R1 and the boundary region R2. In addition, with reference to FIG. 4, the third embodiment comprises, like the second embodiment, the cathode layer 14A in the diode region R3, the cathode layer 14A being apart from collector layer 13. Meanwhile, the diode region R3 according to the third embodiment does not comprise the trench T3, the insulating layer 21c, or the conductive layer 22c unlike the first and second embodiments. Note that in the third embodiment, the anode electrode (not shown) is provided on the upper surface of the anode layer 19.

In the third embodiment, like the second embodiment, the cathode layer 14A formed in the diode region R3 and the collector layer 13 formed on the IGBT region R1 side of the boundary region R2 may reduce the generation of the anode-high-injection diode and the parasitic PNP transistor, thus reducing a malfunction or the like. In addition, the third embodiment does not comprise the trench T3, and thus may increase the region that functions as the anode in the diode region R3 compared to the second embodiment.

Fourth Embodiment

Figure 5:
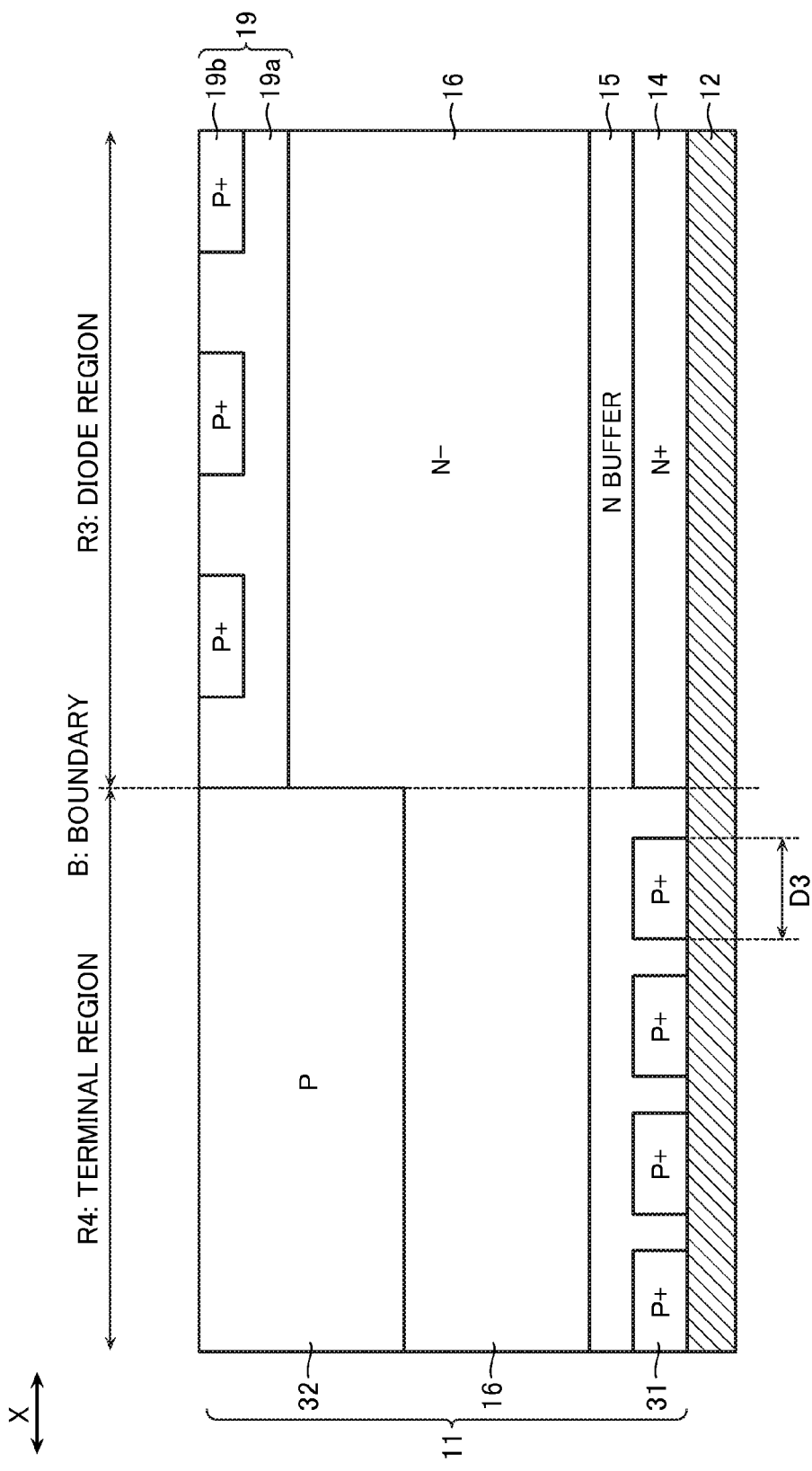
FIG. 5 is the B-B' cross-sectional view in FIG. 1 illustrating a semiconductor device according to a fourth embodiment.

Referring now to FIG. 5, a semiconductor device according to a fourth embodiment will be described. FIG. 5 is the B-B' cross-sectional view in FIG. 1 illustrating the semiconductor device according to the fourth embodiment. First, the diode region R3 will be described. With reference to FIG. 5, in the diode region R3, the cathode layer 14 is formed to the boundary B between the diode region R3 and the terminal region R4. Except that the diode region R3 does not comprise the trench T3, the insulating layer 21c, or the conductive layer 22c, the fourth embodiment has generally the same configuration as the first embodiment. Of course, the diode region R3 may comprise the trench T3, the insulating layer 21c, and the conductive layer 22c. Note that the anode electrode (not shown) is formed in contact with the low concentration anode layer 19a and the high concentration anode layer 19b.

The terminal region R4 will now be described. FIG. 5 illustrates the case where the terminal region R4 and the diode region R3 that are in contact with each other. The terminal region R4 comprises the common electrode 12 extending from the diode region R3, the buffer layer 15, and the drift layer 16. Further, the terminal region R4 comprises a semiconductor region 31 and a diffusion layer 32.

The semiconductor region 31 is positioned at the same layer level as the cathode layer 14. The semiconductor region 31 is in contact with the upper surface of the common electrode 12 and is repeatedly provided at a predetermined pitch in the X direction. The semiconductor region 31 comprises a P+ type semiconductor. Note that in the terminal region R4, the buffer layer 15 is in contact with the upper surface and the side surfaces of the semiconductor region 31.

The diffusion layer 32 is provided to prevent the breakdown voltage degradation of the terminal region R4. The diffusion layer 32 is in contact with the upper surface of the drift layer 16 and extends to the boundary B. The diffusion layer 32 comprises a P type semiconductor of a high impurity concentration.

The effects from the above configuration according to the fourth embodiment will now be described. It is now assumed that unlike FIG. 5, the cathode layer 14 is continuously formed to the terminal region R4. When the P type diffusion layer 32 is present in the terminal region R4, which has a high impurity concentration and functions as a guard ring layer, the cathode layer 14 of an N type present in a region immediately below the layer 32 may cause, in the diffusion layer 32, the drift layer 16, the buffer layer 15, and the cathode layer 14, the diode having a high injection anode in the terminal region R4, thus contributing to degradation of the characteristics of the entire diode. In view thereof, thereof, in the fourth embodiment, the cathode layer 14 is not provided in the terminal region R4. The fourth embodiment may thus reduce the operation of the anode-high-injection diode in the terminal region R4.

In addition, if, in the terminal region R4, a large contact area exists between the buffer layer 15 and the common electrode 12, a problem arises in that the Schottky junction between the buffer layer 15 and the common electrode 12 may increase the leak current. In view thereof, therefore, in the fourth embodiment, the semiconductor region 31 (P+ type) is provided on the upper surface of the common electrode 12 in the terminal region R4, thus decreasing the area of the Schottky junction between the buffer layer 15 and the common electrode 12. The fourth embodiment may thus suppress the increase of the leak current.

If, however, the semiconductor region 31 has a large width D3 in the terminal region R4, a reverse bias applied to the diode in the diode region R3 allows holes to be injected from the semiconductor region 31, thus allowing the operation of the parasitic PNP transistor. In view thereof, therefore, in the fourth embodiment, the semiconductor region 31 preferably has a width D3 of 30 μm or less in order to prevent the operation of the parasitic PNP transistor. Thus, the fourth embodiment may reduce the operation of the parasitic PNP transistor, thereby reducing a malfunction of the device or the like.

Figure 6:
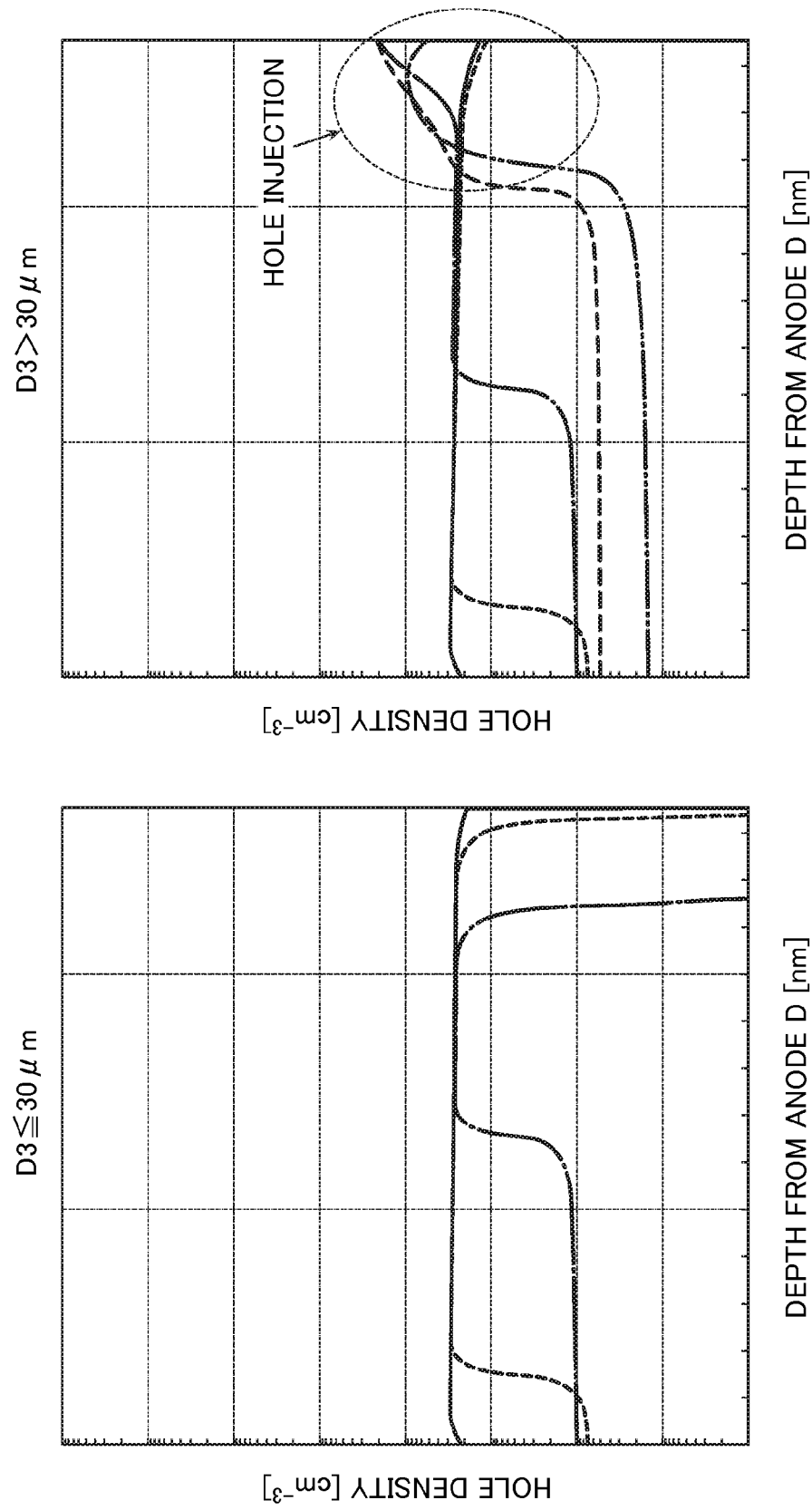
FIG. 6 shows graphs illustrating the effects of an fourth embodiment.

FIG. 6 shows graphs (simulation results) showing the changes in amount of injected holes with respect to sizes of the width D3 of the semiconductor region 31.

The left graph in FIG. 6 shows, for a width D3 of 30 μm or less, the relationship between the distance from the anode of the diode in the diode region R3 and the hole density. In the left graph, the solid curve shows the hole density distribution at the time t0 when the diode in the diode region R3 is switched from the forward bias to the reverse bias. The broken curve and the one-dot chain curve show the hole density distribution at the times t1 and t2 after the time to, respectively. For a distance D3 of 30 μm or less, holes are not injected from the semiconductor region 31.

Meanwhile, the right graph in FIG. 6 shows, for a width D3 of 30 μm or more, the relationship between the distance from the anode of the diode in the diode region R3 and the hole density.

In the right graph, the solid curve shows the hole density distribution at the time t0 when the diode in the diode region R3 is switched from the forward bias to the reverse bias, and the broken curve, the one-dot chain curve, and the two-dot chain curve show the hole density distribution at the times t1, t2, and t3 after the time t0, respectively. For a width D3 of 30 μm or more, it is seen that holes are injected near the semiconductor region 31. This allows the operation of the parasitic PNP transistor, which contributes to a malfunction of the entire device or the like. Therefore, in this embodiment, the width D3 of the semiconductor region 31 is set to 30 μm or less.

Fifth Embodiment

Figure 7:
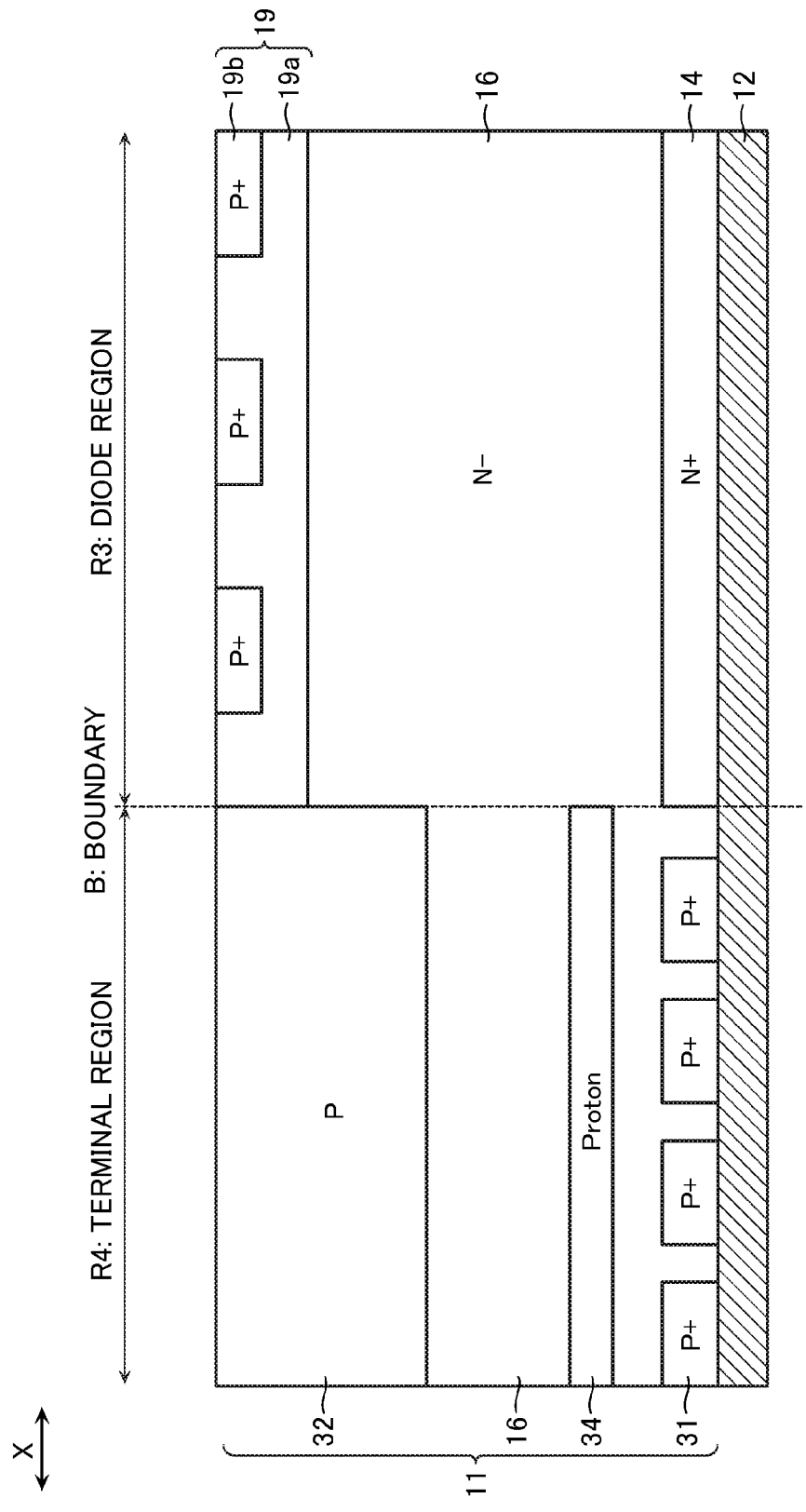
FIG. 7 is the B-B' cross-sectional view in FIG. 1 illustrating a semiconductor device according to a fifth embodiment.

Referring now to FIG. 7, a semiconductor device according to a fifth embodiment will be described. FIG. 7 is the B-B' cross-sectional view in FIG. 1 illustrating the semiconductor device according to the fifth embodiment. With reference to FIG. 7, the semiconductor device according to the fifth embodiment does not comprise the buffer layer 15 in the diode region R3 and the terminal region R4 unlike the fourth embodiment, and instead comprises the drift layer 16 in contact with the cathode layer 14 and the semiconductor region 31.

Meanwhile, with reference to FIG. 7, the fifth embodiment comprises a buffer layer 34 in the drift layer 16 in the terminal region R4. The buffer layer 34 is positioned apart from the semiconductor regions 31 and 32 and extends in the X direction to the boundary B. The end portion of the buffer layer 34 may be retracted from the boundary B to the terminal region R4 side or projected to the diode region R3 side. The buffer layer 34 comprises a hydrogen ion and is formed by the ion implantation or the like. This may prevent the punch-through of the depletion layer in the semiconductor region 31 when the reverse bias is applied. Note that in the fifth embodiment, the other components are generally the same as those in the fourth embodiment and accordingly they are designated with like reference numerals and their detailed description is omitted here.

The fifth embodiment has generally the same configuration and may provide generally the same effects as the fourth embodiment. In addition, the buffer layer 34 may maintain the breakdown voltage of the terminal region R4.

Sixth Embodiment

Figure 8:
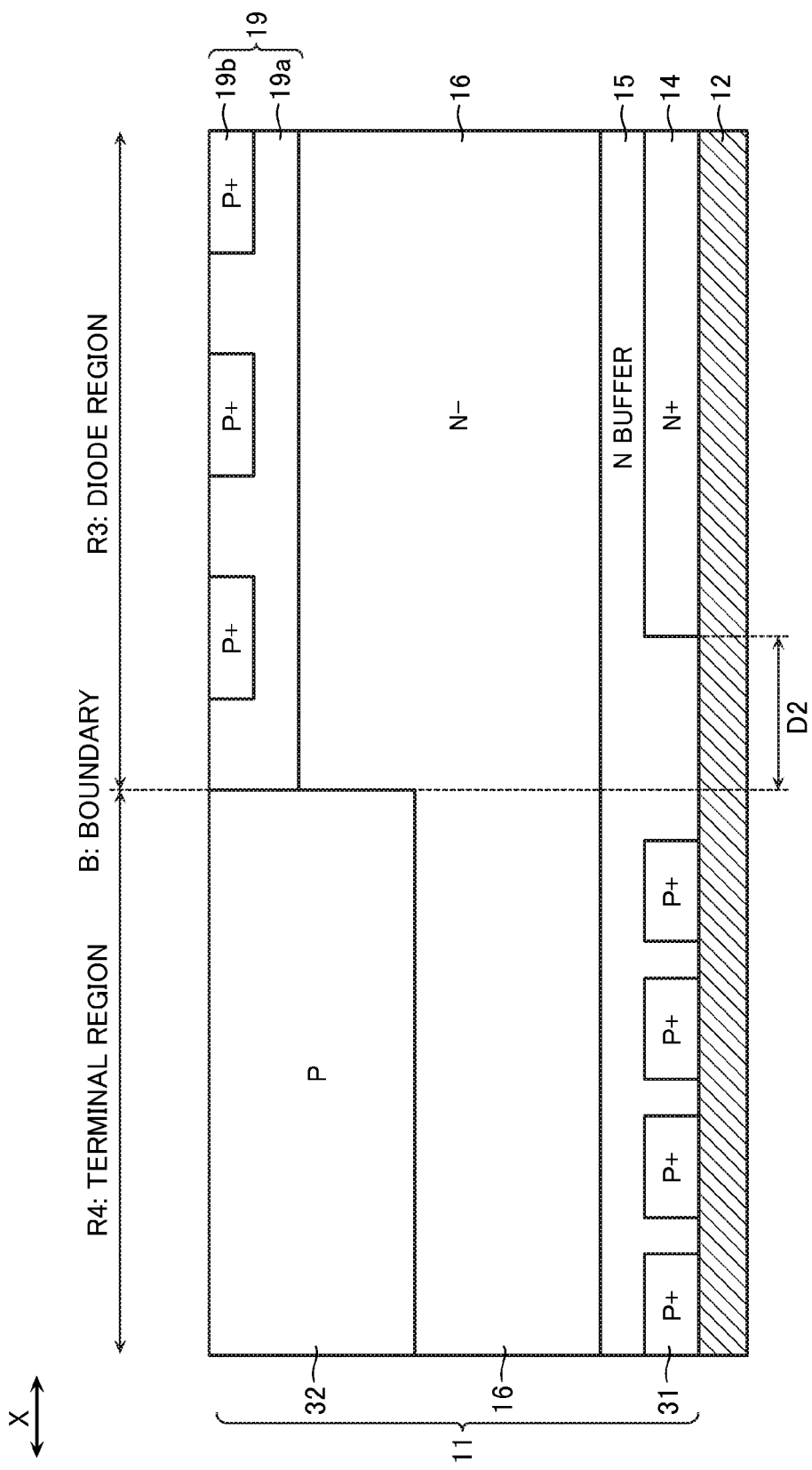
FIG. 8 is the B-B' cross-sectional view in FIG. 1 illustrating a semiconductor device according to a sixth embodiment.

Referring now to FIG. 8, a semiconductor device according to a sixth embodiment will be described. FIG. 8 is the B-B' cross-sectional view in FIG. 1 illustrating the semiconductor device according to the sixth embodiment. With reference to FIG. 8, in the diode region R3 according to the sixth embodiment, the cathode layer 14 is formed apart from the boundary B by a predetermined distance D2. Regarding the shape of the cathode layer 14, the sixth embodiment is different from the fourth embodiment. In the sixth embodiment, the other components are generally the same as those in the fourth embodiment and accordingly they are designated with like reference numerals and their detailed description is omitted here.

As described above, in the sixth embodiment, the cathode layer 14 is apart from the boundary B by the predetermined distance D2. Thus, the sixth embodiment may further reduce the generation of the high injection diode in the terminal region R4 than the fourth embodiment.

Seventh Embodiment

Figure 9:
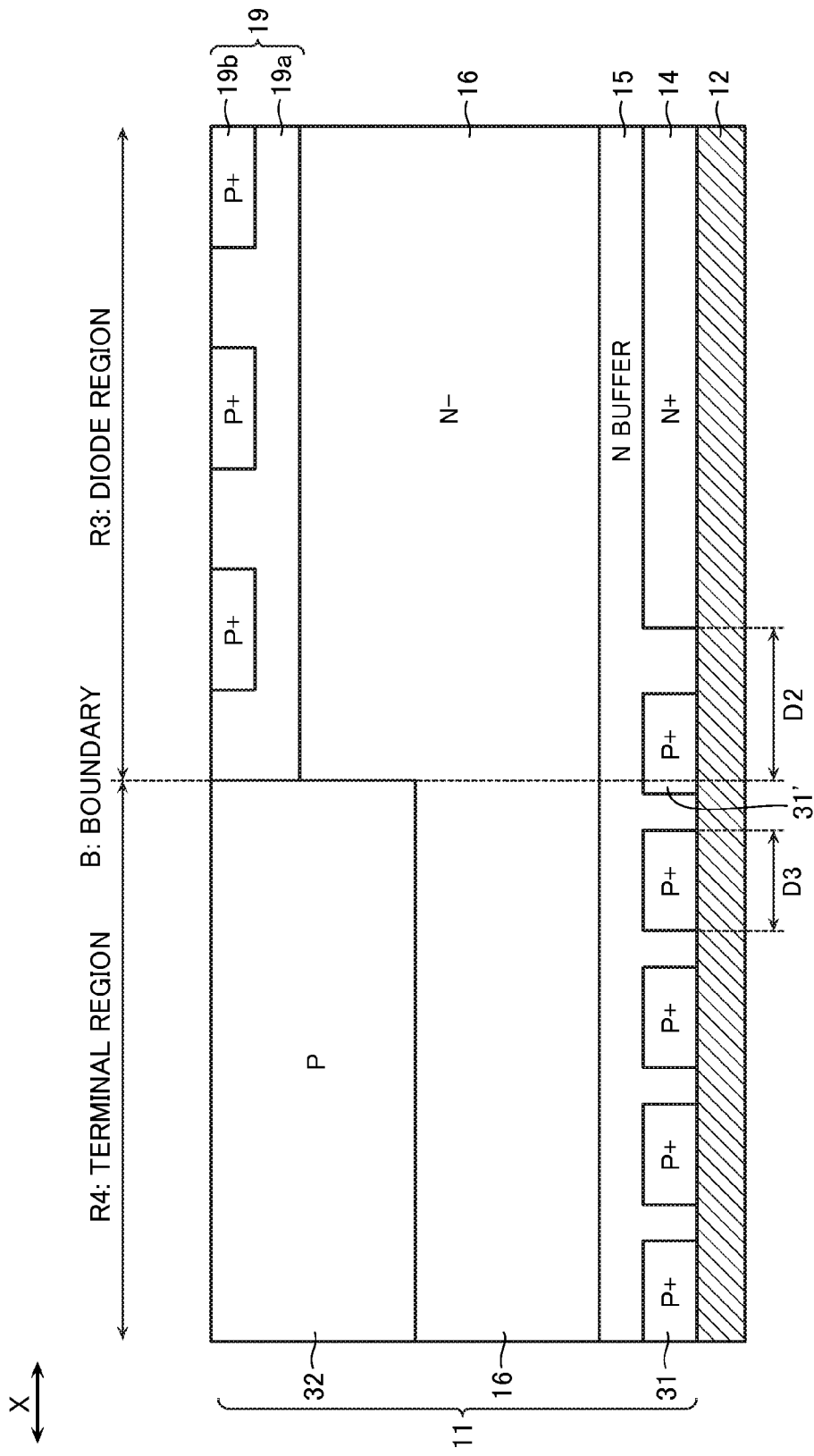
FIG. 9 is the B-B' cross-sectional view in FIG. 1 illustrating a semiconductor device according to a seventh embodiment.

Referring now to FIG. 9, a semiconductor device according to a seventh embodiment will be described. FIG. 9 is the B-B' cross-sectional view in FIG. 1 illustrating the semiconductor device according to the seventh embodiment. With reference to FIG. 9, in the diode region R3 according to the seventh embodiment, a semiconductor region 31' generally the same as the semiconductor region 31 is formed in the terminal region R4 as well as in the diode region R3. In the seventh embodiment, the other components are generally the same as those in the fourth embodiment and accordingly they are designated with like reference numerals and their detailed description is omitted here.

As described above, in the seventh embodiment, the cathode layer 14 is apart from the boundary B by a predetermined distance D2, like the sixth embodiment. Therefore, the seventh embodiment may further suppress the formation of the high injection diode in the terminal region R4 than in the fourth embodiment. In addition, although the semiconductor region 31' is also formed in the diode region R3, the semiconductor region 31' is provided with a predetermined width D3 in the X direction to prevent the operation of the parasitic PNP transistor. This may reduce a malfunction.

Eighth Embodiment

Figure 10:
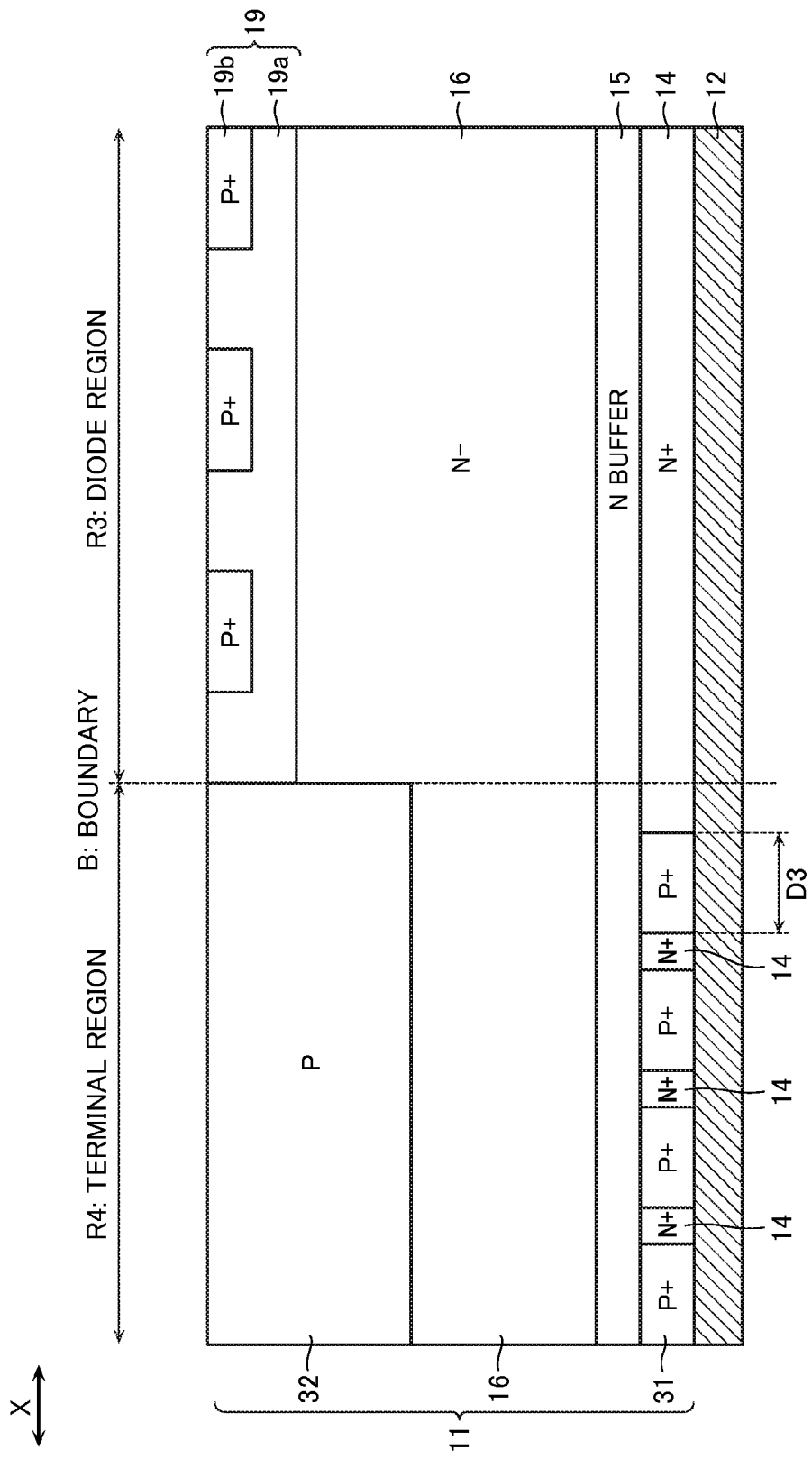
FIG. 10 is the B-B' cross-sectional view in FIG. 1 illustrating a semiconductor device according to an eighth embodiment.

Referring now to FIG. 10, a semiconductor device according to a eighth embodiment will be described. In FIG. 9, like elements as those in the above embodiments are designated with like reference numerals and their description is omitted. FIG. 10 is the B-B' cross-sectional view in FIG. 1 illustrating the semiconductor device according to the eighth embodiment.

In the eighth embodiment, the cathode layer 14 is formed in the diode region R3 as well as in the terminal region R4, and the terminal region R4 comprises, in the cathode layer 14, the semiconductor regions 31 formed at a predetermined pitch in the X direction. As described above, if the cathode layer 14 is present in the terminal region R4, the diode having a high injection anode may be formed in the terminal region R4. In this embodiment, however, the P+ type semiconductor regions 31 are formed at a predetermined pitch in the cathode layer 14 in the terminal region R4. The cathode layer 14 sandwiched between two semiconductor regions 31 may be formed to have a very small width of, for example, 10 μm or less, thereby reducing the formation of the diode having a high injection anode in the terminal region R4.

It is preferable that the semiconductor region 31 has a width D3 of 30 μm or less as described above.

Ninth Embodiment

Figure 11:
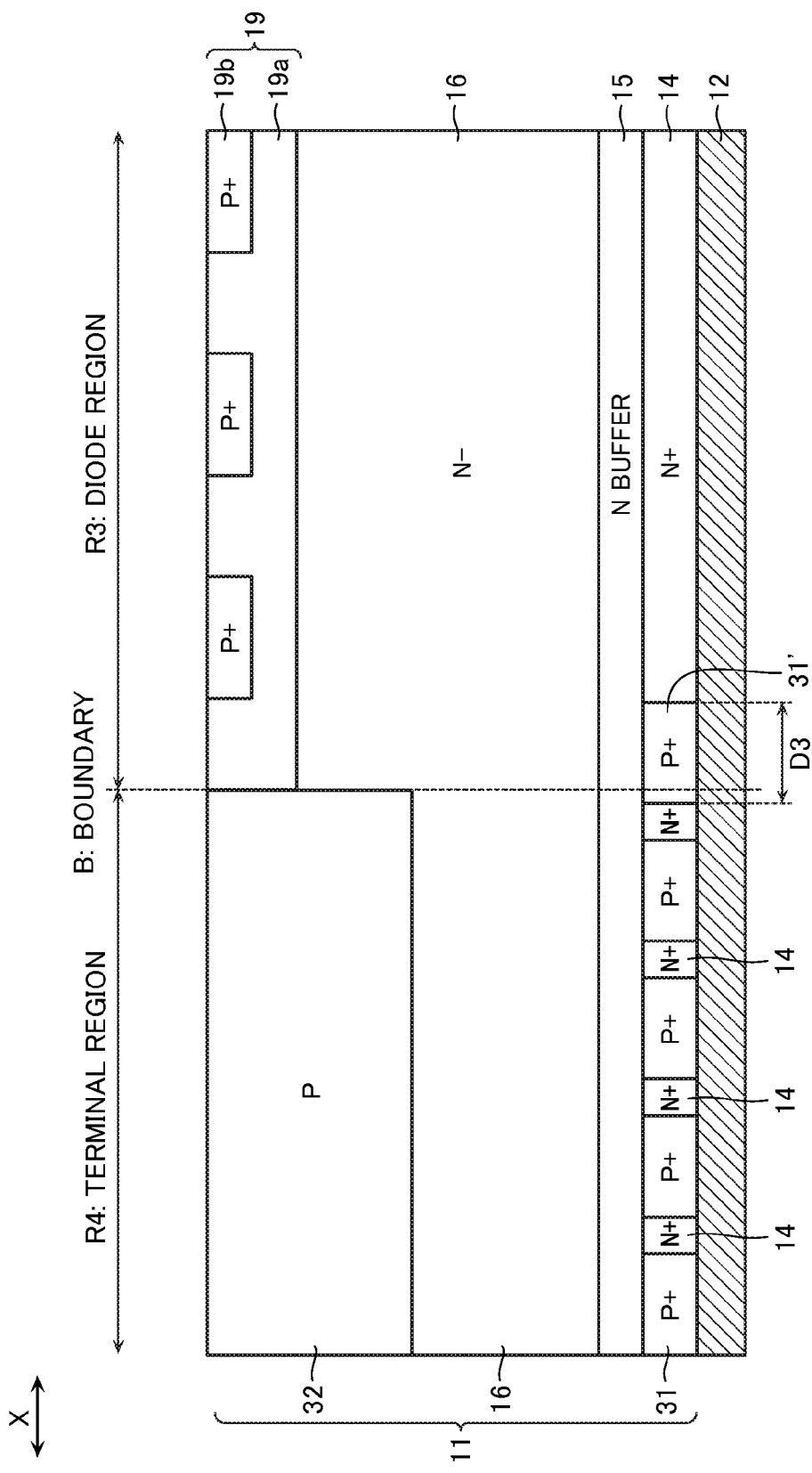
FIG. 11 is the B-B' cross-sectional view in FIG. 1 illustrating a semiconductor device according to a ninth embodiment.

Referring now to FIG. 11, a semiconductor device according to a ninth embodiment will be described. In FIG. 11, like elements as those in the above embodiments are designated with like reference numerals and their description is omitted. FIG. 11 is the B-B' cross-sectional view in FIG. 1 illustrating the semiconductor device according to the ninth embodiment.

With reference to FIG. 11, in the diode region R3 according to the ninth embodiment, the semiconductor region 31' generally the same as the semiconductor region 31 is not only formed in the terminal region R4 but is formed reaching the diode region R3. In the ninth embodiment, the other components are generally the same as those in the eighth embodiment and accordingly they are designated with like reference numerals and their detailed description is omitted here. Since the semiconductor region 31' is also provided in the diode region R3, the ninth embodiment may further suppress the generation of the high injection diode in the terminal region R4 than the eighth embodiment.

Tenth Embodiment

Figure 12:
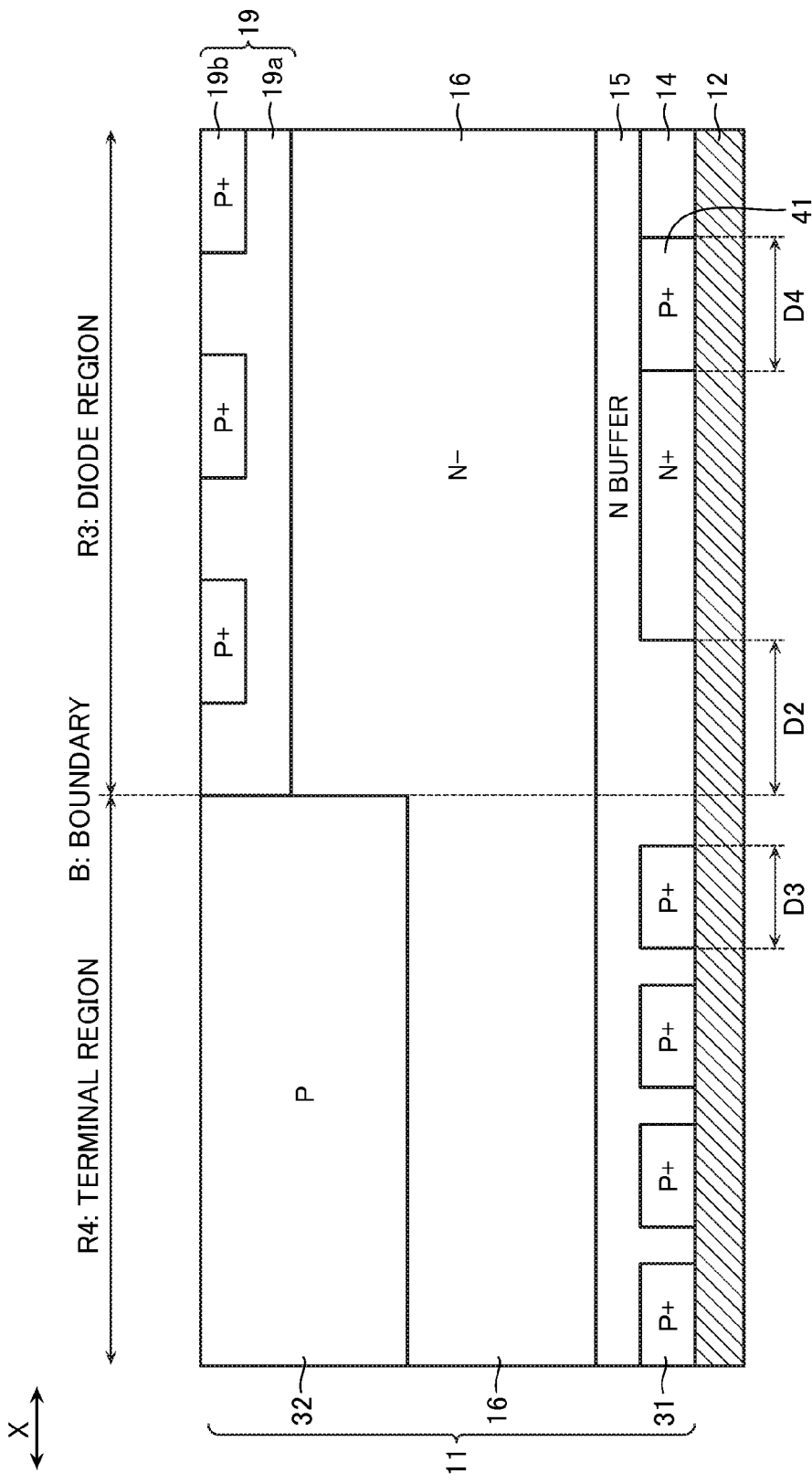
FIG. 12 is the B-B' cross-sectional view in FIG. 1 illustrating a semiconductor device according to a tenth embodiment.

Referring now to FIG. 12, a semiconductor device according to a tenth embodiment will be described. FIG. 12 is the B-B' cross-sectional view in FIG. 1 illustrating the semiconductor device according to the tenth embodiment. In the tenth embodiment, like the sixth embodiment (FIG. 7), the cathode layer 14 is provided only in the diode region R3, and the cathode layer 14 has its end portion positioned in the diode region R3 and formed apart from the boundary B by a predetermined distance D2.

Note, however, that in the 10th embodiment, the P+ type semiconductor region 41 is also formed in the cathode layer 14 in the diode region R3. The width D4 of the P+ type semiconductor region 41 is set to 30 μm or more, which is larger than the width D3 of the P+ type semiconductor region 31, to cause the hole injection. The semiconductor region 41 is provided to reduce, in the diode region R3, the oscillation of voltage and current in the recovery from a low current and to reinject holes when the reverse bias is applied. Note, however, that the width D4 is preferably set to a width that may prevent the reverse recovery time of the diode from being unnecessarily long.

Eleventh Embodiment

Figure 13:
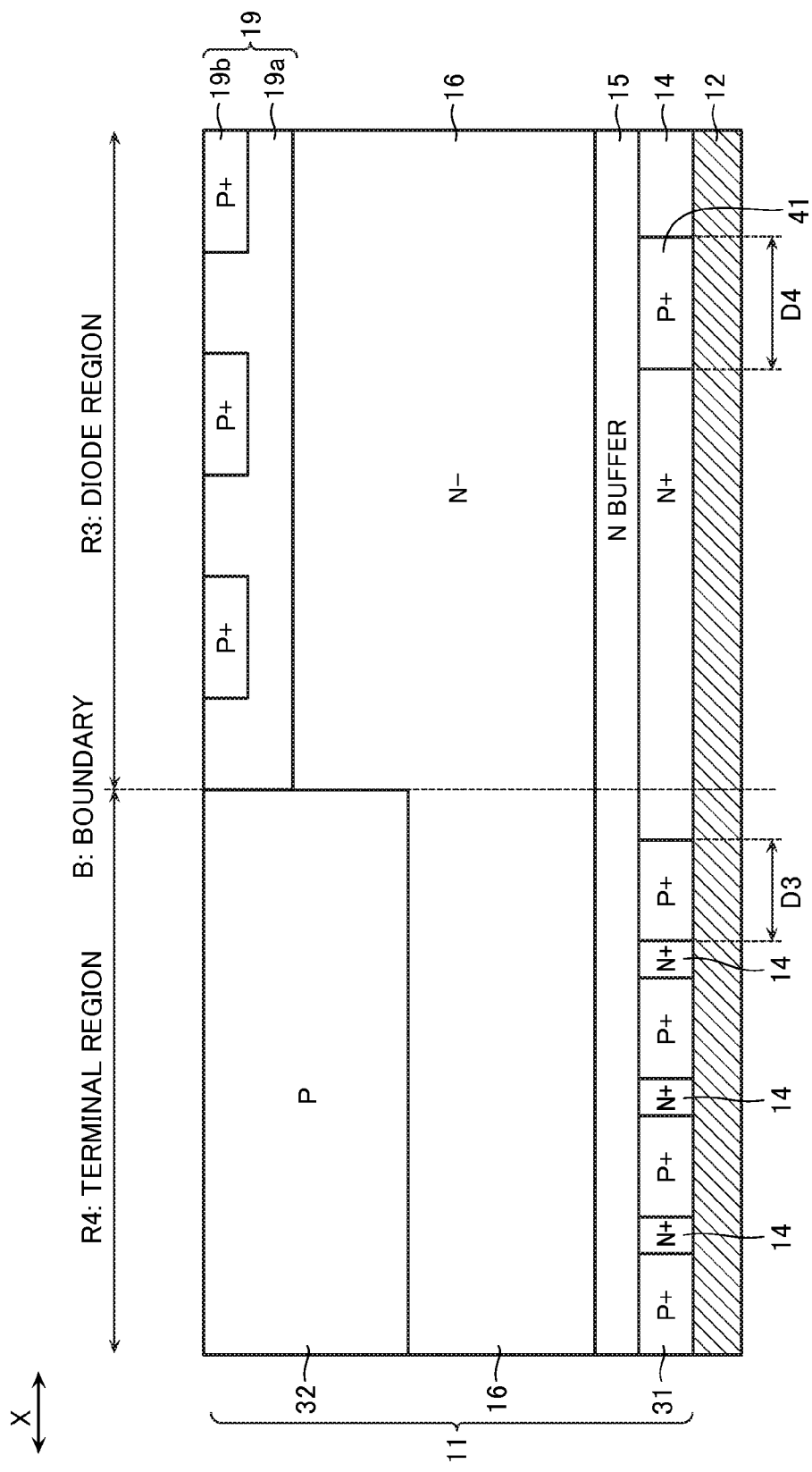
FIG. 13 is the B-B' cross-sectional view in FIG. 1 illustrating a semiconductor device according to an eleventh embodiment.

Referring now to FIG. 13, a semiconductor device according to an eleventh embodiment will be described. FIG. 13 is the B-B' cross-sectional view in FIG. 1 illustrating the semiconductor device according to the eleventh embodiment. In the eleventh embodiment, like the eighth embodiment (FIG. 9), the cathode layer 14 is formed in the diode region R3 as well as in the terminal region R4. Then, the P+ type semiconductor regions 31 are formed at a predetermined pitch in the cathode layer 14 in the terminal region R4.

Note, however, that in the eleventh embodiment, the P+ type semiconductor region 41 is formed in the cathode layer 14 in the diode region R3. The P+ type semiconductor region 41 has a width D4 larger than the width D3 of the P+ type semiconductor region 31. The reason for D4>D3 is the same as that in the 10th embodiment.

Twelfth Embodiment

Figure 14:
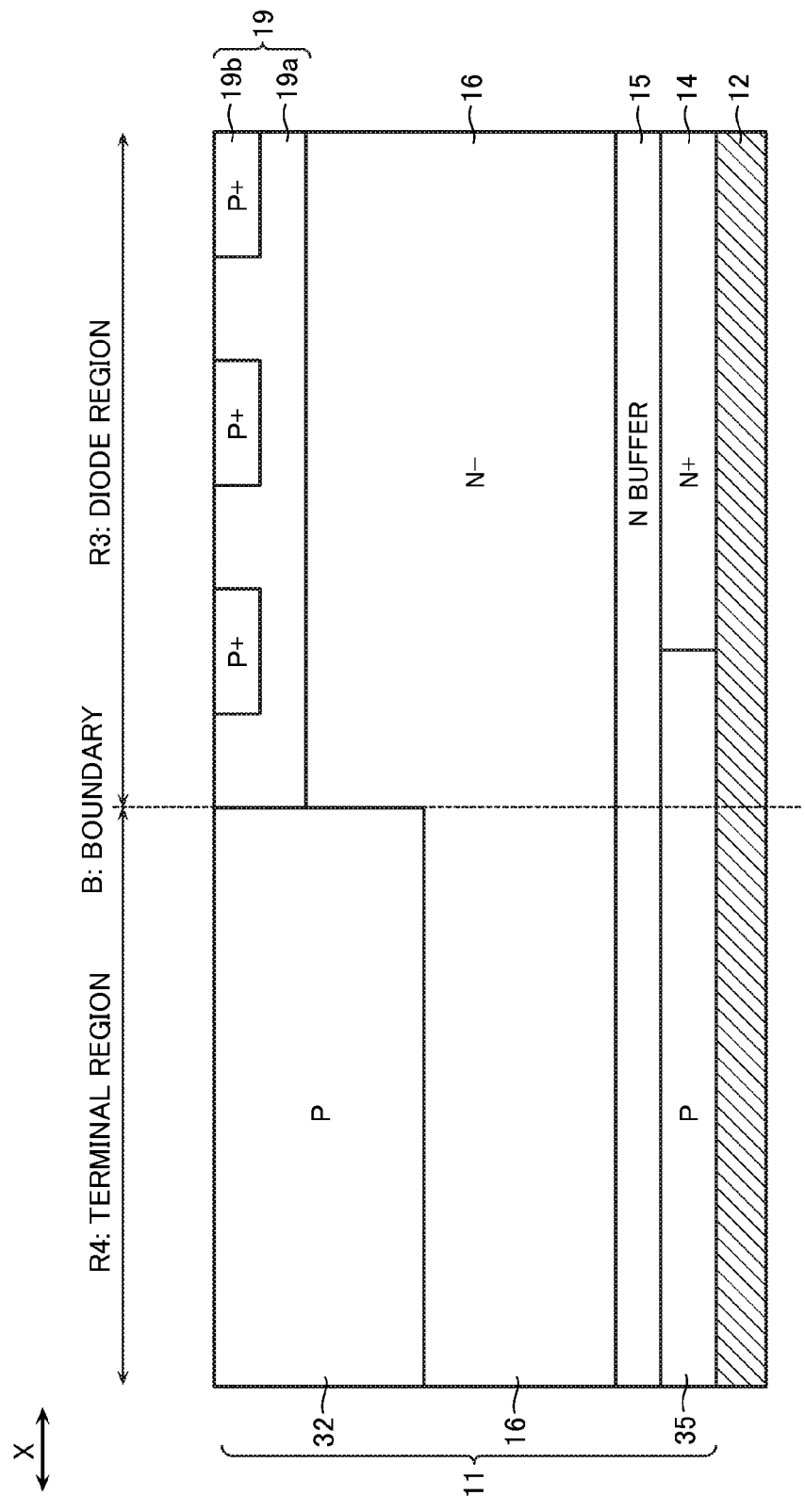
FIG. 14 is the B-B' cross-sectional view in FIG. 1 illustrating a semiconductor device according to a twelfth embodiment.

Referring now to FIG. 14, a semiconductor device according to a twelfth embodiment will be described. In FIG. 14, like elements as those in the above embodiments are designated with like reference numerals and their description is omitted. FIG. 14 is the B-B' cross-sectional view in FIG. 1 illustrating the semiconductor device according to the twelfth embodiment. In the twelfth embodiment, the cathode layer 14 is only formed in the diode region R3, and its end portion is present in the diode region R3. Then, the P type semiconductor region 35 is formed in the terminal region R4 as well as in the diode region R3 beyond the boundary B. Note, however, that the P type semiconductor region 35 has a low impurity concentration at the interface and is set to a concentration (for example, of about $3\times10^{17}$ cm$^{-3}$) that allows formation of the Schottky junction between the P type semiconductor region 35 and the common electrode 12. The Schottky junction may reduce the operation of the parasitic PNP transistor in the terminal region R4. Thus, the operation of the parasitic PNP transistor in the terminal region R4 may be suppressed, thereby preventing an element breakage and a malfunction. Note that the ohmic contact formed between the N+ type cathode layer 14 and the common electrode 12 may allow the correct operation of the diode in the diode region R3. In addition, in order that the P type semiconductor region 35 and the common electrode 12 are in Schottky junction with each other and the N+ type cathode layer 14 and the common electrode 12 are in ohmic contact with each other, it is necessary to appropriately select the combination of the interface concentrations of the P type diffusion layer 35 and N+ type cathode layer 14 and the material of the common electrode 12.

Thirteenth Embodiment

Figure 15:
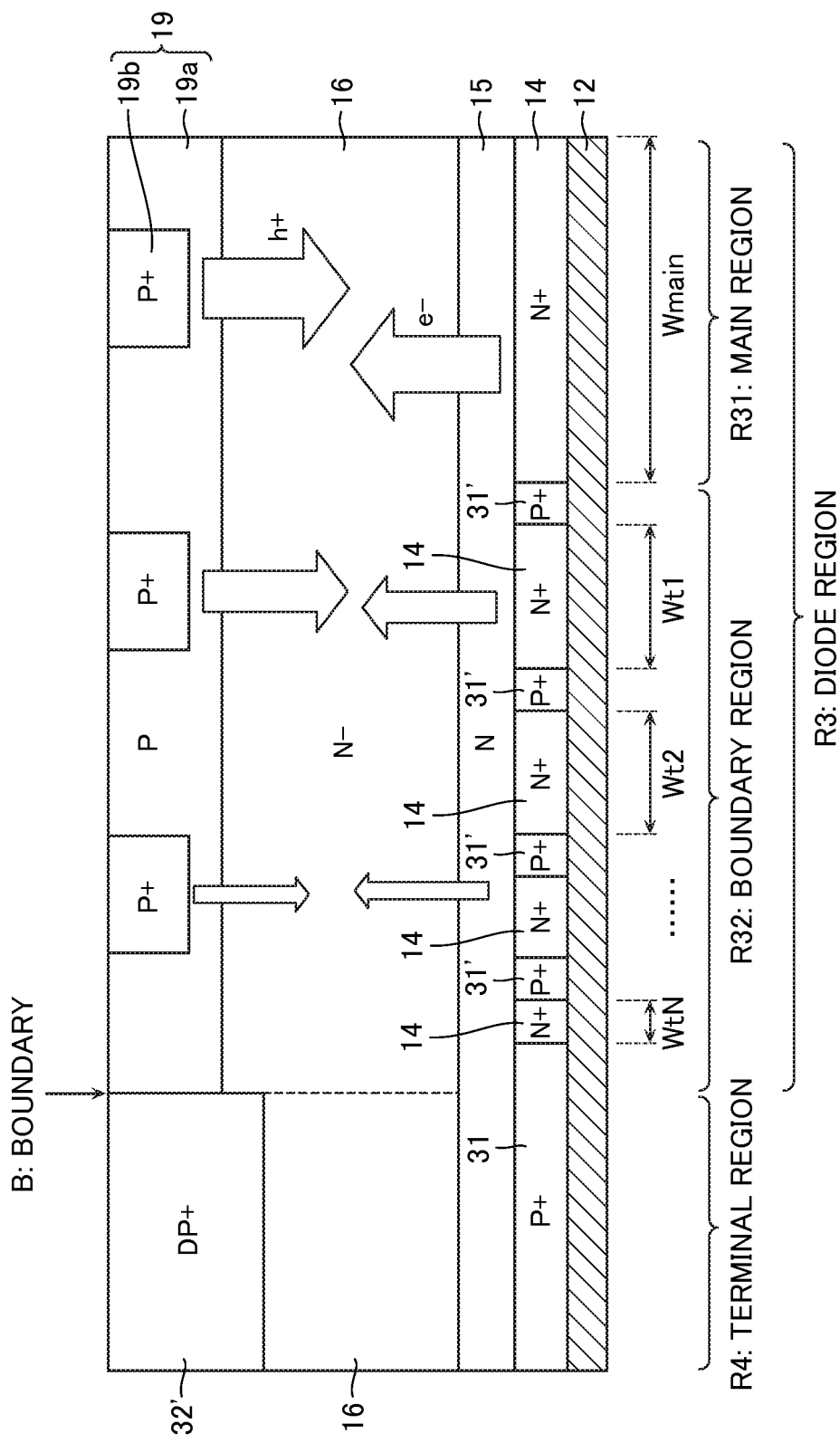
FIG. 15 is the B-B' cross-sectional view in FIG. 1 illustrating a semiconductor device according to a thirteenth embodiment.

Referring now to FIG. 15, a semiconductor device according to a thirteenth embodiment will be described. In FIG. 15, like elements as those in the above embodiments are designated with like reference numerals and their description is omitted. FIG. 15 is the B-B' cross-sectional view in FIG. 1 illustrating the semiconductor device according to the thirteenth embodiment. In this embodiment, a description is given assuming that the diode region R3 comprises a main region R31 where the diode is formed and a boundary region R32 that surrounds the main region R31 and is contact with the terminal region R4. In other words, the boundary region R32 is a region in the diode region R3 that is in contact with the boundary B between the diode region R3 and the terminal region R4.

In the thirteenth embodiment, the cathode layer 14 is present in the main region R31 as well as in the boundary region R32. Note, however, that the cathode layer 14 in the boundary region R32 is provided as divided into a plurality of regions in the horizontal direction, and the divided regions decrease in width W (area) in the B-B' direction as they approach the terminal region R4 (Wmain>Wt1>Wt2> . . . >WtN). The P+ type semiconductor region 31' is formed between the divided cathode regions 14.

According to the configuration, the boundary region R32 may also be used effectively as the diode region. In other words, the cathode layer 14, the buffer layer 15, the drift layer 16, and the anode layer 19 in the boundary region R32 may also function as the diode. Note, however, that since the cathode layers 14 decrease in width W as they approach the terminal region R4, the characteristics of the diode in the boundary region R32 degrade as it approaches the terminal region R4 (see the white arrows in FIG. 15). This may allow for the effective utilization of the boundary region R32 as the diode and reduce the degradation of the reverse recovery characteristics of the diode due to the hole injection from the P+ type diffusion layer 32 in the terminal region R4.

Fourteenth Embodiment

Figure 16:
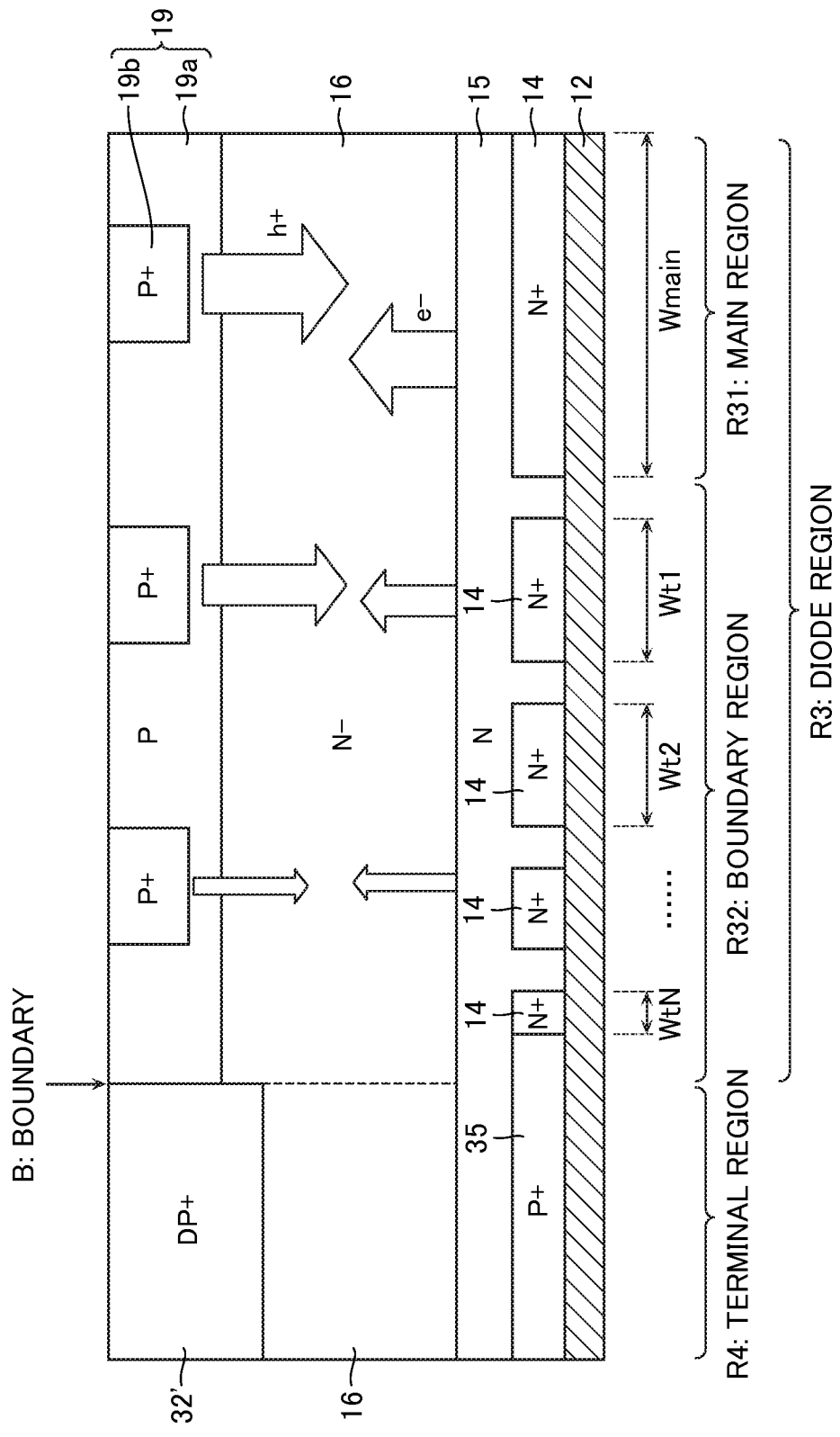
FIG. 16 is the B-B' cross-sectional view in FIG. 1 illustrating a semiconductor device according to a fourteenth embodiment.

Referring now to FIG. 16, a semiconductor device according to a fourteenth embodiment will be described. In FIG. 16, like elements as those in the thirteenth embodiment are designated with like reference numerals and their description is omitted. FIG. 16 is the B-B' cross-sectional view in FIG. 1 illustrating the semiconductor device according to the 14th embodiment. In this embodiment, in the boundary region R32, the P+ type semiconductor region 31' is not present between the divided cathode layers 14, and instead the N type buffer layer 15 is formed between the cathode layers 14. Otherwise, the 14th embodiment is similar to the thirteenth embodiment. The configuration in the 14th embodiment may also provide the same effects as in the thirteenth embodiment.

Fifteenth Embodiment

Figure 17:
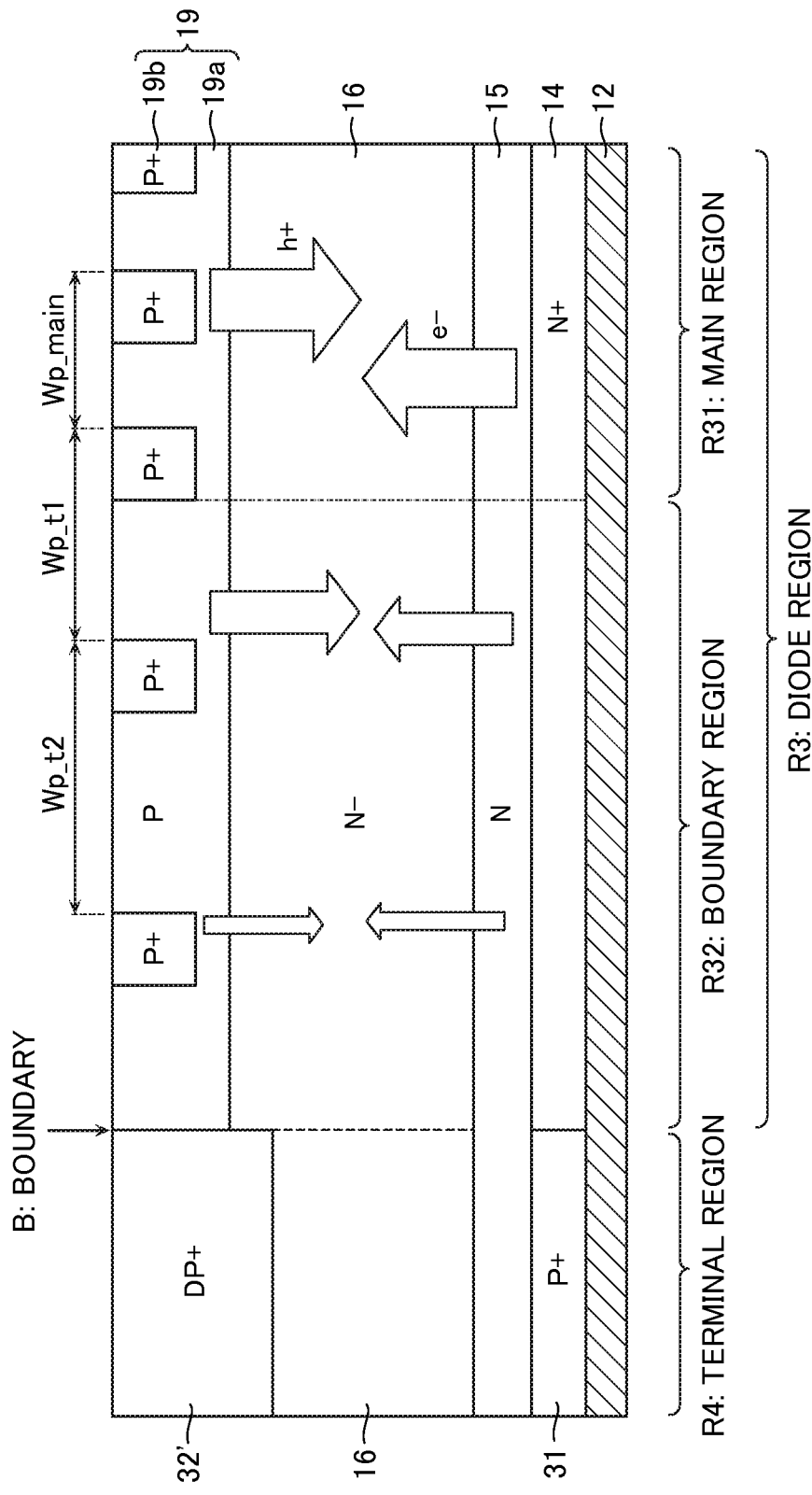
FIG. 17 is the B-B' cross-sectional view in FIG. 1 illustrating a semiconductor device according to a fifteenth embodiment.

Referring now to FIG. 17, a semiconductor device according to a fifteenth embodiment will be described. In FIG. 17, like elements as those in the thirteenth embodiment are designated with like reference numerals and their description is omitted here. In the fifteenth embodiment, the cathode layer 14 is not divided in the boundary region R32 and extends to the boundary B. In this regard, the 15th embodiment is different from the thirteenth and fourteenth embodiments. Note, however, that in the fifteenth embodiment, the high concentration anode layer 19b is set to increase in array pitch as it approaches the terminal region R4 (Wp_main<Wp_t1<Wp_t2). Thus, also in this embodiment, the characteristics of the diode formed in the boundary region R32 degrade as it approaches the terminal region R4 (see the white arrows in FIG. 15). This may allow for the effective utilization of the boundary region R32 as the diode and reduce the degradation of the reverse recovery characteristics of the diode due to the hole injection from the P+ type diffusion layer 32 into the terminal region R4.

Sixteenth Embodiment

Figure 18:
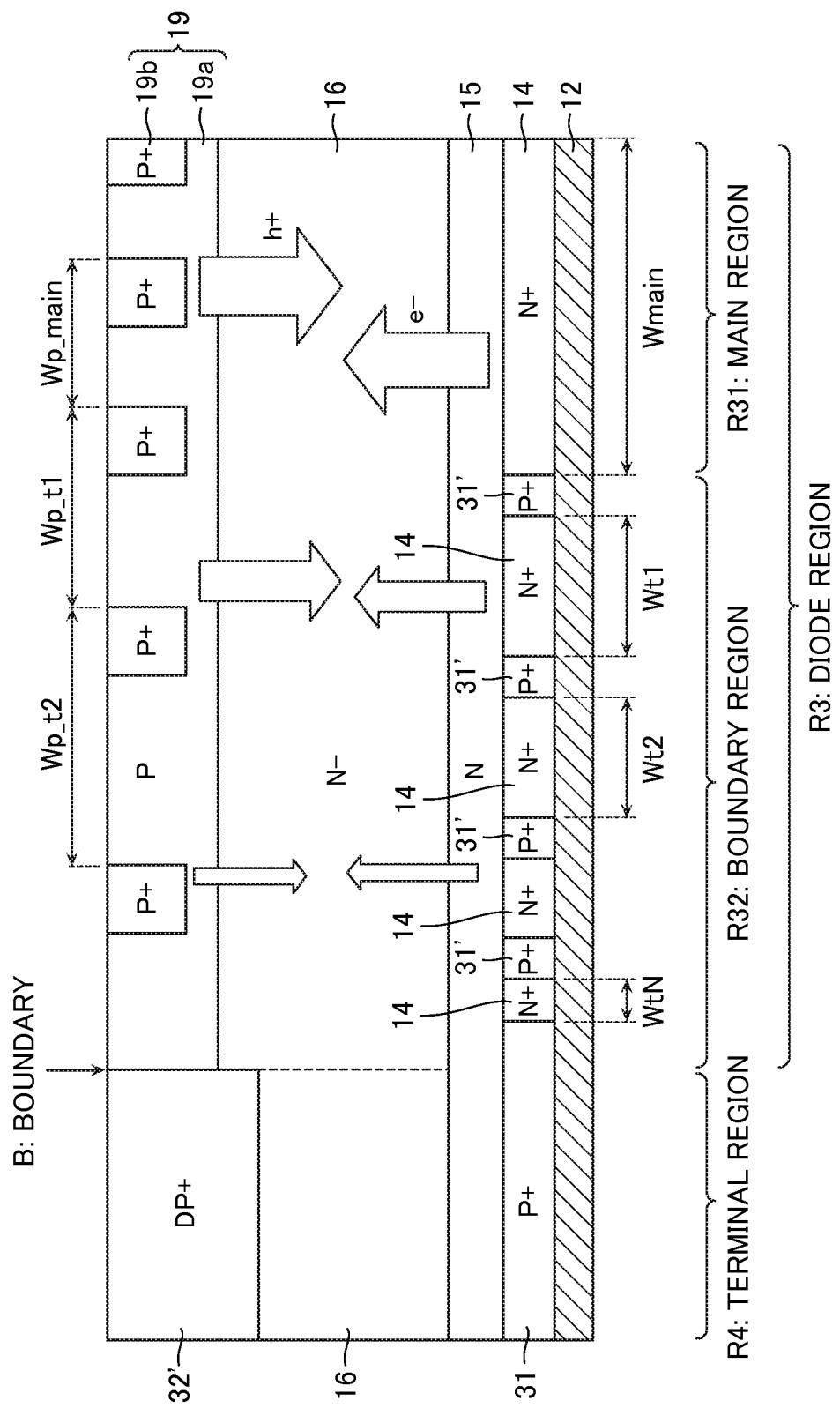
FIG. 18 is the B-B' cross-sectional view in FIG. 1 illustrating a semiconductor device according to a sixteenth embodiment.

Referring now to FIG. 18, a semiconductor device according to a sixteenth embodiment will be described. In FIG. 18, like elements as those in the above embodiments are designated with like reference numerals and their description is omitted. The sixteenth embodiment is the combination of the feature of the thirteenth embodiment and the feature of the fifteenth embodiment. In other words, in the boundary region R32, the cathode layer 14 is divided into a plurality of sublayers, and the sublayers gradually decrease in width W in the B-B' direction as they approach the terminal region R4 (Wmain>Wt1>Wt2>WtN). In addition, the high concentration anode layer 19b is set to increase in array pitch as it approaches the terminal region R4 (Wp_main<Wp_t1<Wp_t2). This configuration may also provide the same effects as in the thirteenth to fifteenth embodiments. Note that in FIG. 18, the cathode layer 14 and the buffer layer 15 may have the same configuration as in the fourteenth embodiment.

Seventeenth Embodiment

Figure 19:
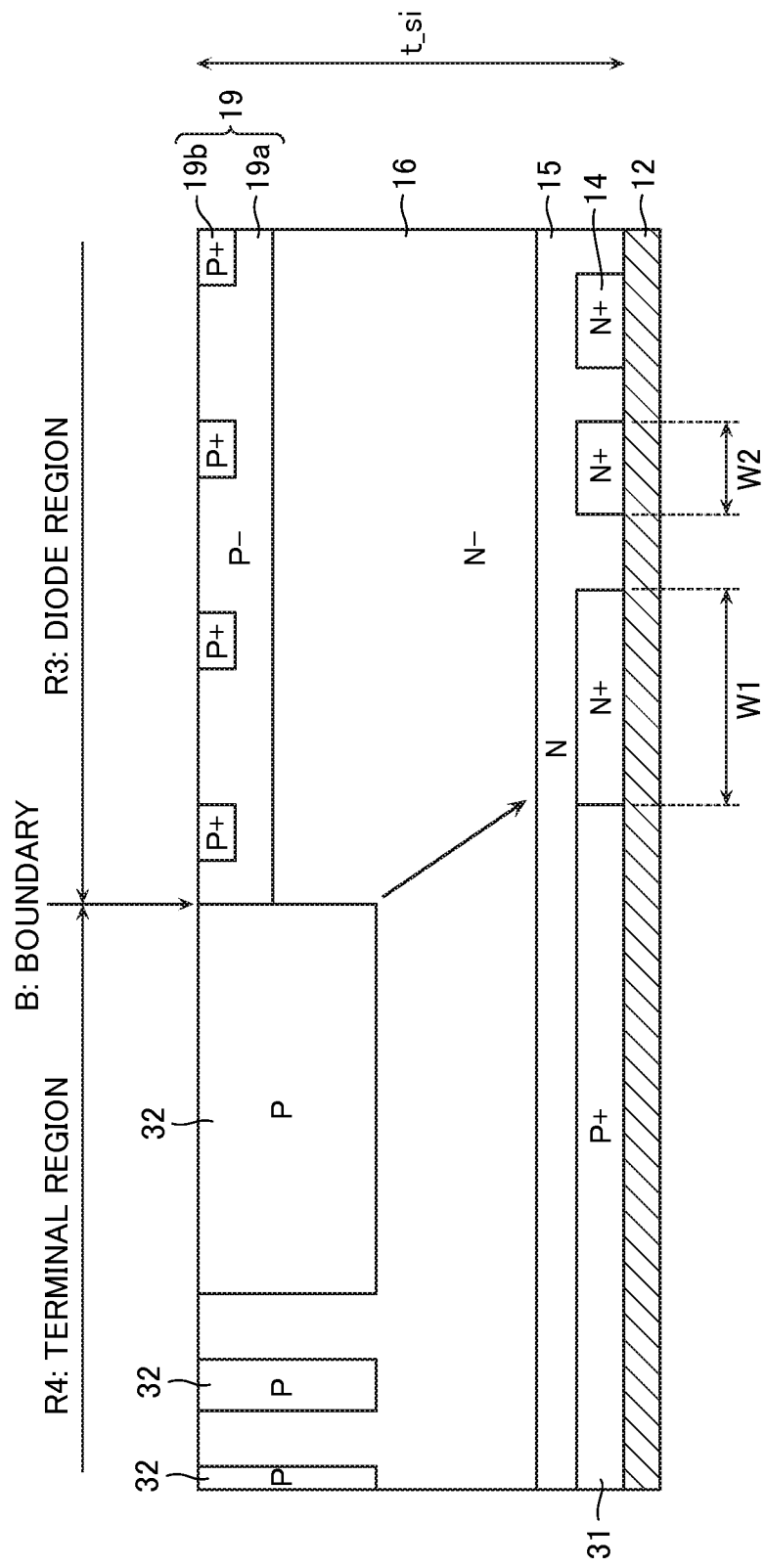
FIG. 19 is the B-B' cross-sectional view in FIG. 1 illustrating a semiconductor device according to a seventeenth embodiment.

Referring now to FIG. 19, a semiconductor device according to a Seventeenth embodiment will be described. In FIG. 19, like elements as those in the above embodiments are designated with like reference numerals and their description is omitted. In the seventeenth embodiment, in the diode region R3, the N+ type cathode layer 14 is provided as divided into sublayers in the buffer layer 15, and thus the buffer layer 15 and the common electrode 12 together form a Schottky diode. Thus, the diode formed in the diode region R3 is a low-injection-cathode diode as a whole.

In this embodiment, in order that the diffusion layer 32, the drift layer 16, the buffer layer 15, and the cathode layer 14 do not provide the diode having a high injection anode in the terminal region R4, the outermost cathode layer 14 (that is nearest to the boundary B) in the diode region R3 is not present immediately below the boundary B and has its end portion at a position moved from the boundary B into the diode region R3 by a predetermined distance. Instead, the P+ type semiconductor region 31 is provided immediately below the boundary B. Therefore, the structure near the boundary B is a PNP structure, and thus the parasitic diode is not formed near the boundary B. Here, the same effect may be provided by replacing the P+ type semiconductor region 31 with a P− type semiconductor region.

Further, the width W1 of the outermost cathode layer 14 is set to be larger than the width W2 of the other cathode layers 14. In this way, the end portion of the outermost cathode layer 14 is inside the boundary B and the width W1 of the cathode layer 14 is set to be larger than the width W2. Thus, the carriers intensively generated near the boundary B are absorbed by the cathode layer 14 of the large width (W1), thus making it possible to reduce the probability of occurrence of the element breakage. According to this embodiment, the cathode layer 14 of the width W1 may be provided outermost in the diode region R3, thus avoiding the reduction of the switching speed of the diode.

Note that a too large width W1 allows the formation of the diode of high injection characteristics near the boundary, thus increasing the loss of the diode. Therefore, the width W1 may be set to a value that may reduce the element breakage in the recovery and provide the appropriate loss characteristics of the diode.

Eighteenth Embodiment

Figure 20:
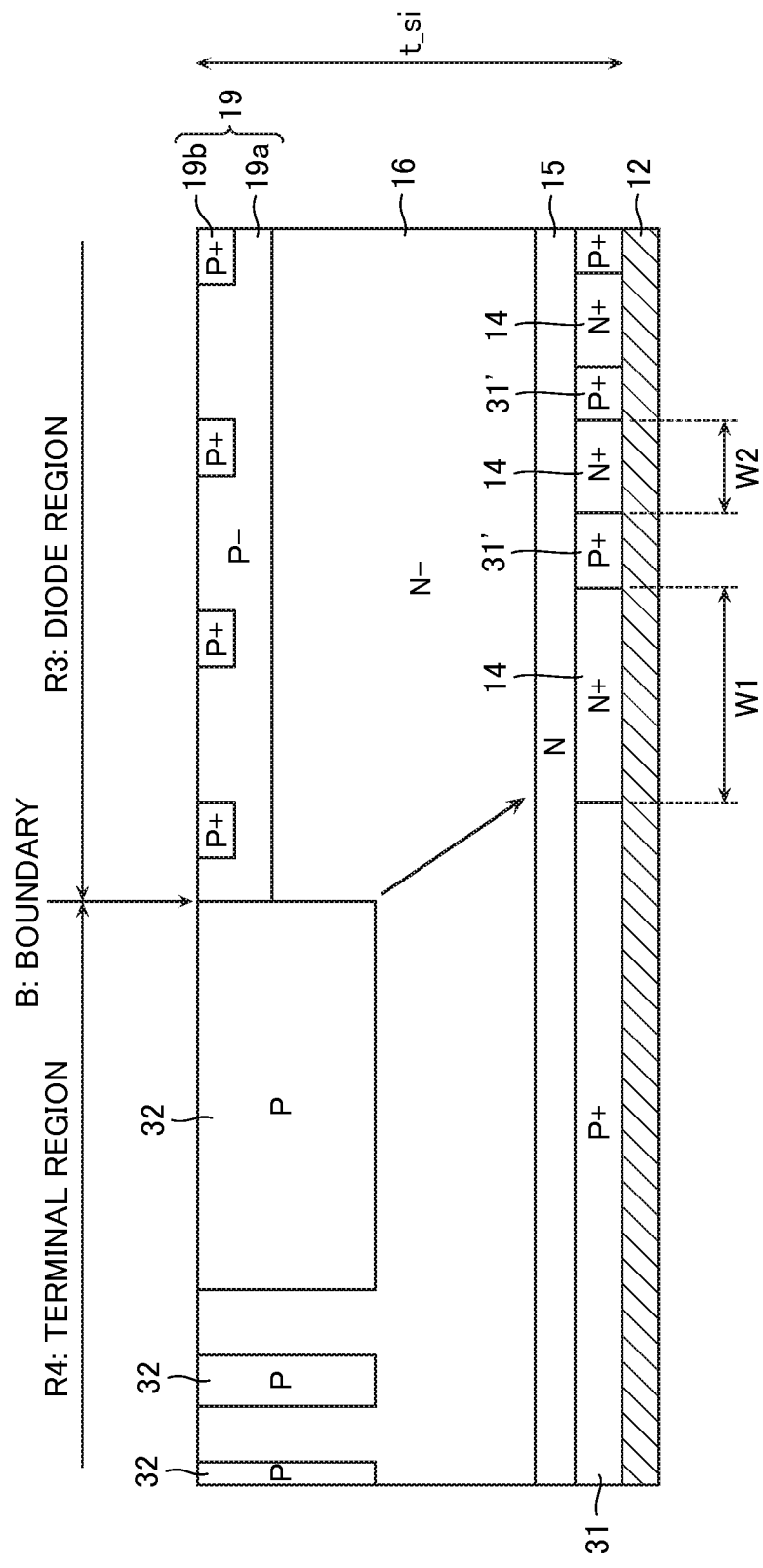
FIG. 20 is the B-B' cross-sectional view in FIG. 1 illustrating a semiconductor device according to an eighteenth embodiment.

Referring now to FIG. 20, a semiconductor device according to a 18th embodiment will be described. In FIG. 20, like elements as those in the 17th embodiment are designated with like reference numerals and their description is omitted here. According to this embodiment, in the diode region R3, the P+ type semiconductor region 31' is formed between the divided N+ type cathode layers 14, thus reducing the oscillation at a constant current. Also in this embodiment, the width W1 of the cathode layer 14 nearest to the boundary B is set to be larger than the width W2 of the other cathode layers 14. Thus, the carriers intensively generated near the boundary B are absorbed by the cathode layer 14 of the large width (W1), thus making it possible to reduce the probability of occurrence of the element breakage. Note that the width W1 may be set to a value that may reduce the element breakage in the recovery and provide the appropriate loss characteristics of the diode, like the seventeenth embodiment.

Nineteenth Embodiment

Figure 21:
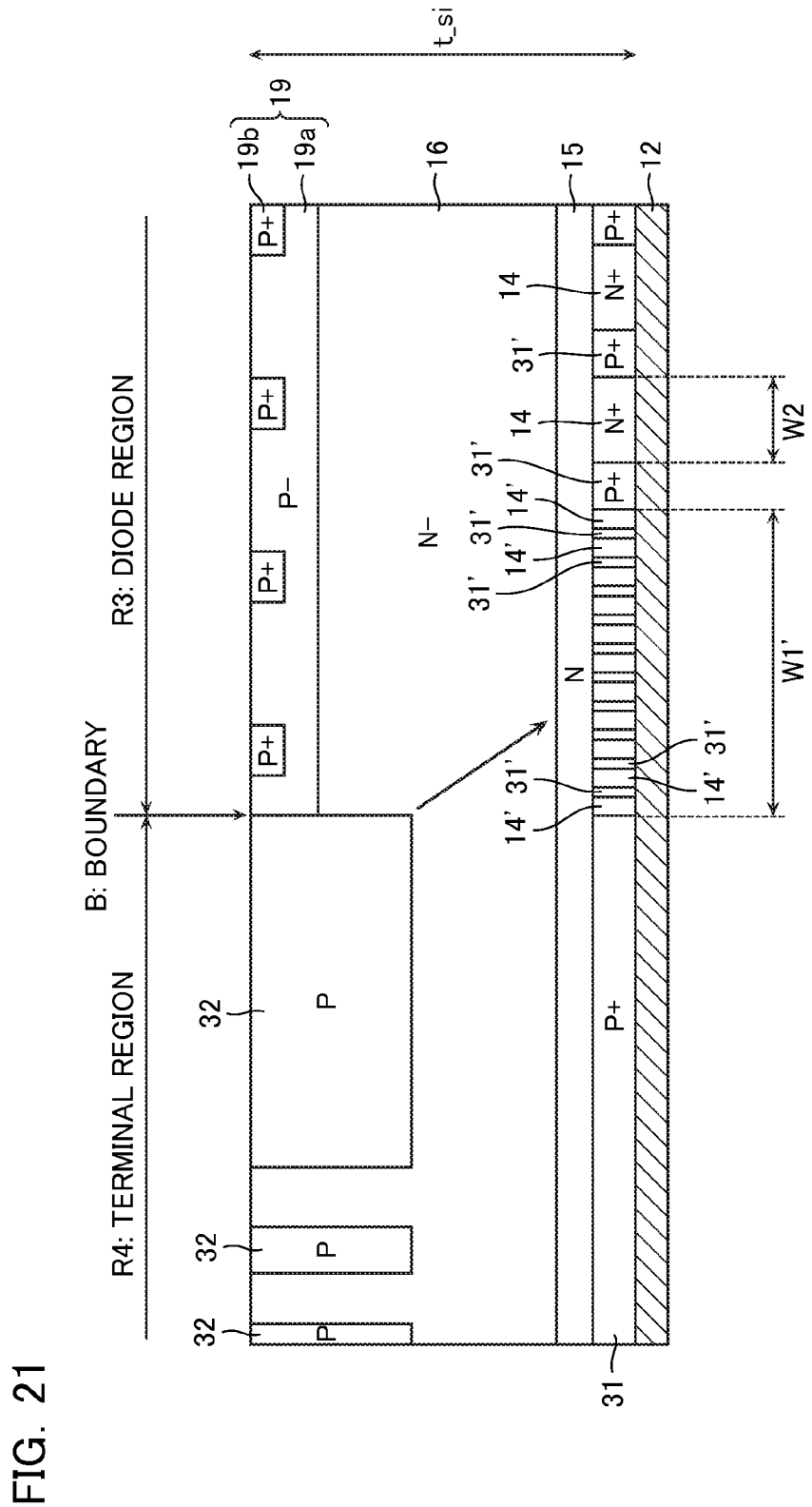
FIG. 21 is the B-B' cross-sectional view in FIG. 1 illustrating a semiconductor device according to a nineteenth embodiment.

Referring now to FIG. 21, a semiconductor device according to a nineteenth embodiment will be described. In FIG. 21, like elements as those in the above embodiments are designated with like reference numerals and their description is omitted. In this embodiment, in the diode region R3, the P+ type semiconductor region 31' is formed between the divided N+ type cathode layers 14, thus reducing the oscillation at a constant current, like the eighteenth embodiment.

Note, however, that in this embodiment, the cathode layer 14 adjacent to the boundary B is divided into a large number of small areas 14' and the P type semiconductor regions 31' are alternately formed between these small areas 14'. Then, the width W1' of the portion where the large number of small areas 14' are provided is set to be larger than the width W2. This configuration may also provide the same effects as in the seventeenth to eighteenth embodiments. Note that preferably, the width of one small area 14' is set to a very small value (for example, about 1 to 2 μm), while the width W1' is set to be larger than at least the width W2.

Twentieth Embodiment

Figure 22:
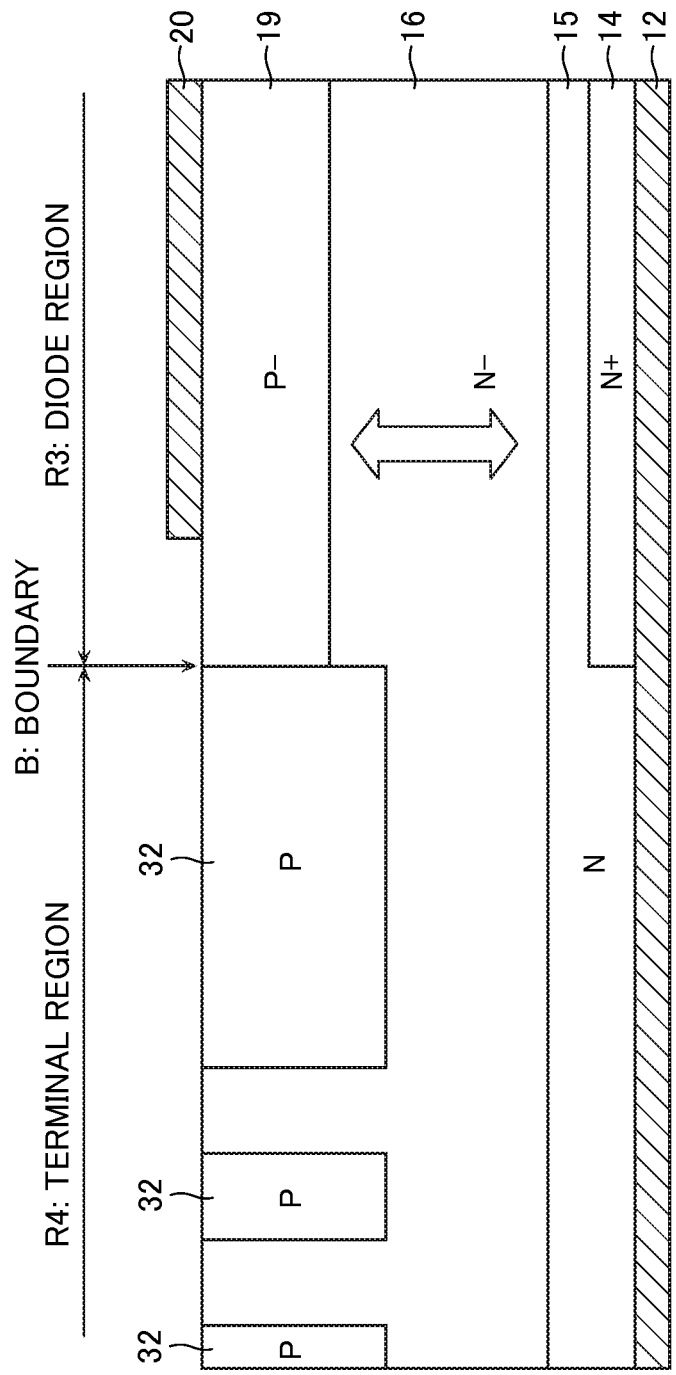
FIG. 22 is the B-B' cross-sectional view in FIG. 1 illustrating a semiconductor device according to a twentieth embodiment.

Referring now to FIG. 22, a semiconductor device according to a twentieth embodiment will be described. In FIG. 22, like elements as those in the above embodiments are designated with like reference numerals and their description is omitted.

In this embodiment, the N+ type cathode layer 14 in the diode region R3 extends to the boundary B between the diode region R3 and the terminal region R4. In addition, the N type buffer layer 15 extends in the diode region R3 as well as in the terminal region R4. Further, the P type diffusion layer 32, which functions as the guard ring layer, is provided in the surface of the terminal region R4. Note, however, that the anode electrode 20 is electrically connected only to the anode layer 19 and not connected to the P type diffusion layer 32 (isolated). Thus, a parasitic diode with high injection is not formed near the boundary B and only the low-injection parasitic diode is formed near it. This may reduce the on-voltage and the switching time without reducing the safe operation area (in which voltage application under a flow of the recovery current does not cause the element breakage) at turn-off.

If it is assumed that in FIG. 22, the P type diffusion layer 32 at the boundary B is connected to the anode electrode 20, the high injection parasitic diode is formed at the boundary B, thus reducing the switching characteristics of the diode in the diode region R3. The configuration according to this embodiment may solve this problem.

Twenty-First Embodiment

Figure 23:
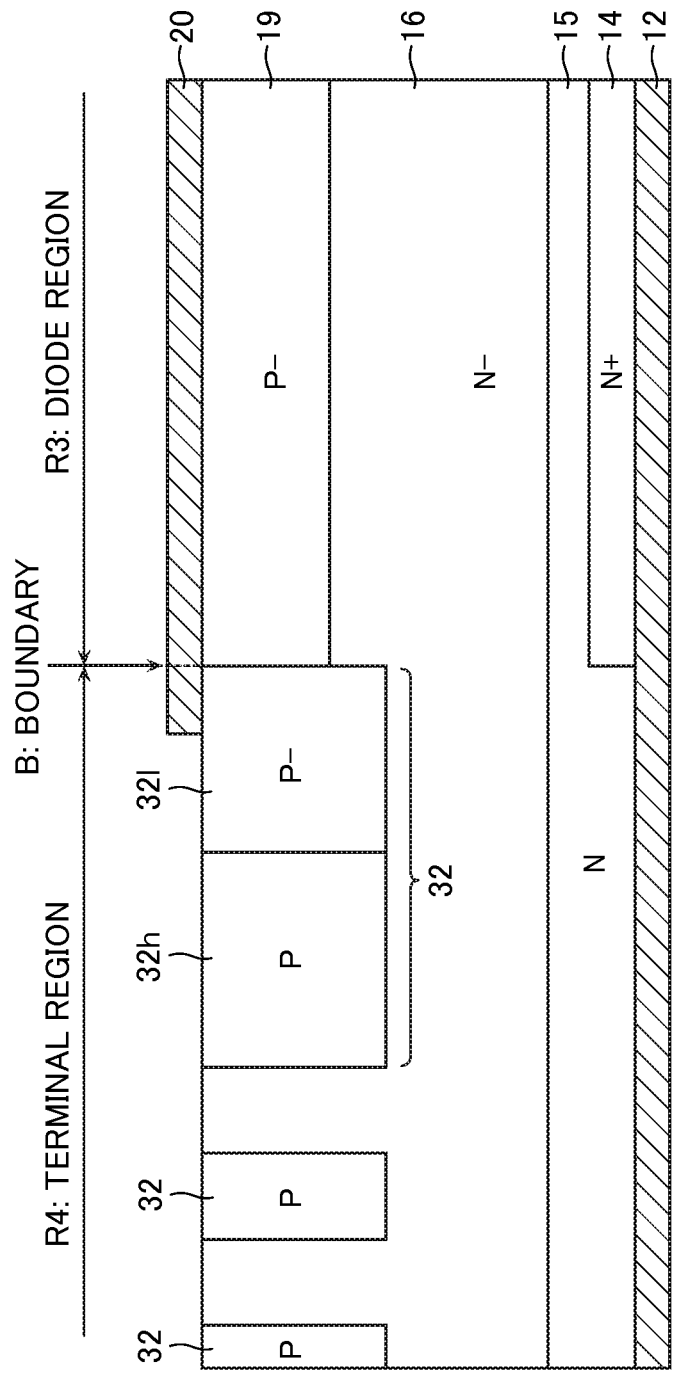
FIG. 23 is the B-B' cross-sectional view in FIG. 1 illustrating a semiconductor device according to a twenty-first embodiment.

Referring now to FIG. 23, a semiconductor device according to a Twenty-first embodiment will be described. In FIG. 23, like elements as those in the above embodiments are designated with like reference numerals and their description is omitted.

In this embodiment, the N+ type cathode layer 14 in the diode region R3 extends to the boundary B between the diode region R3 and the terminal region R4. In addition, the P type diffusion layer 32, which functions as the guard ring layer, is formed on the anode electrode 20 side of the terminal region. In this regard, the 21st embodiment is the same as the nineteenth embodiment.

Note, however, that in this embodiment, the P type diffusion layer 32 formed at the boundary B comprises, on the boundary B side thereof, a low concentration region 32*l*. Then, the anode electrode 20 is electrically connected only to the low concentration region 32*l* and not to a high concentration region 32*h* (the end portion of the anode electrode 20 is present on the low concentration region 32*l*). Thus, the high-injection parasitic diode is not formed near the boundary B and only the low-injection parasitic diode is formed near it. This may reduce the on-voltage and the switching time without reducing the safe operation area (in which voltage application under a flow of the recovery current does not cause the element breakage) at turn-off.

With reference to FIG. 23, if it is assumed that the P type diffusion layer 32 positioned at the boundary B only comprises the high concentration region 32*h* as a whole and is also connected to the anode electrode 20, the high injection parasitic diode is formed at the boundary B, thereby reducing the switching characteristics of the diode in the diode region R3. The configuration according to this embodiment may solve this problem.

Twenty-Second Embodiment

Figure 24:
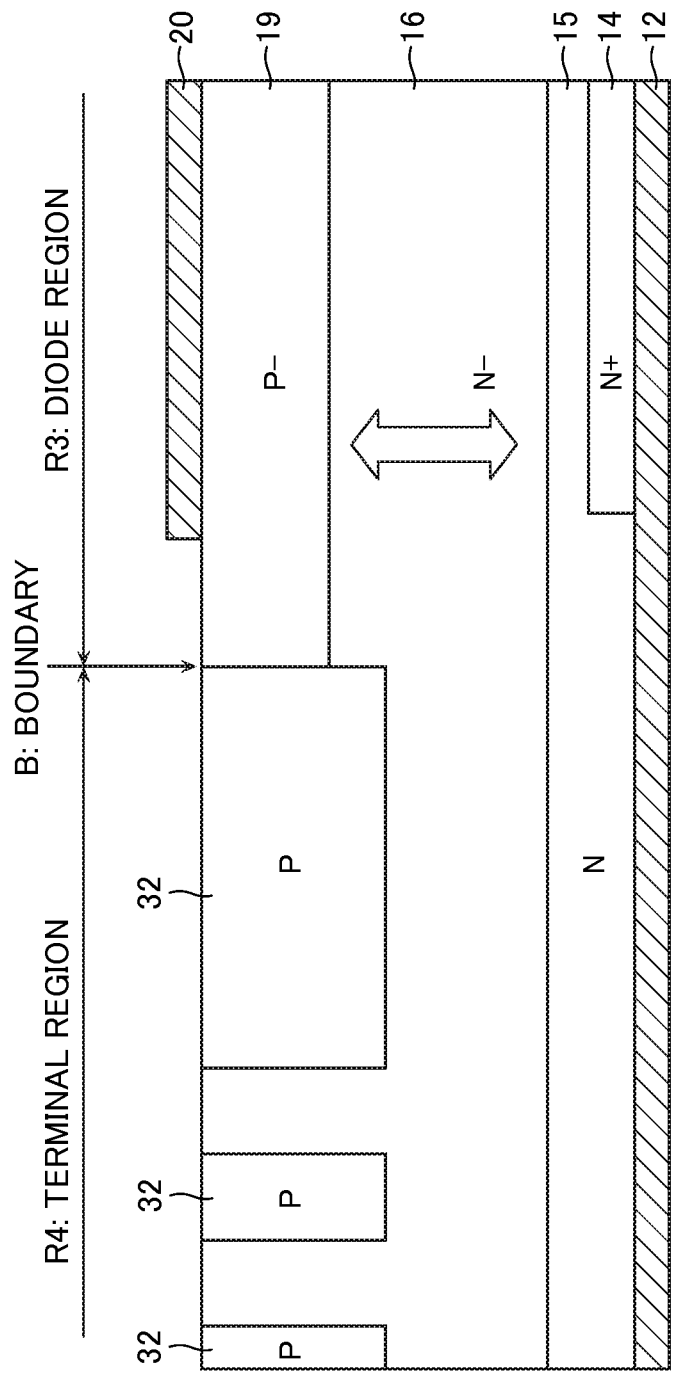
FIG. 24 is the B-B' cross-sectional view in FIG. 1 illustrating a semiconductor device according to a twenty-second embodiment.

Referring now to FIG. 24, a semiconductor device according to a twenty-second embodiment will be described. In FIG. 24, like elements as those in the above embodiments are designated with like reference numerals and their description is omitted.

In this embodiment, the N+ type cathode layer 14 in the diode region R3 does not extend to the boundary B between the diode region R3 and the terminal region R4, but has its end portion at a position moved from the boundary B to the diode region R3 side by a predetermined distance.

In addition, the P type diffusion layer 32, which functions as the guard ring layer, is formed on the anode electrode 20 side of the terminal region. Note, however, that the anode electrode 20 is not connected to the P type diffusion layer 32 formed in the boundary B. The anode electrode 20 is only connected to the anode layer 19. Thus, the high injection parasitic diode is not formed near the boundary B and only the low injection parasitic diode is formed near it. The twenty-second embodiment may thus provide the same effects as in the above embodiments.

Twenty-Third Embodiment

Figure 25:
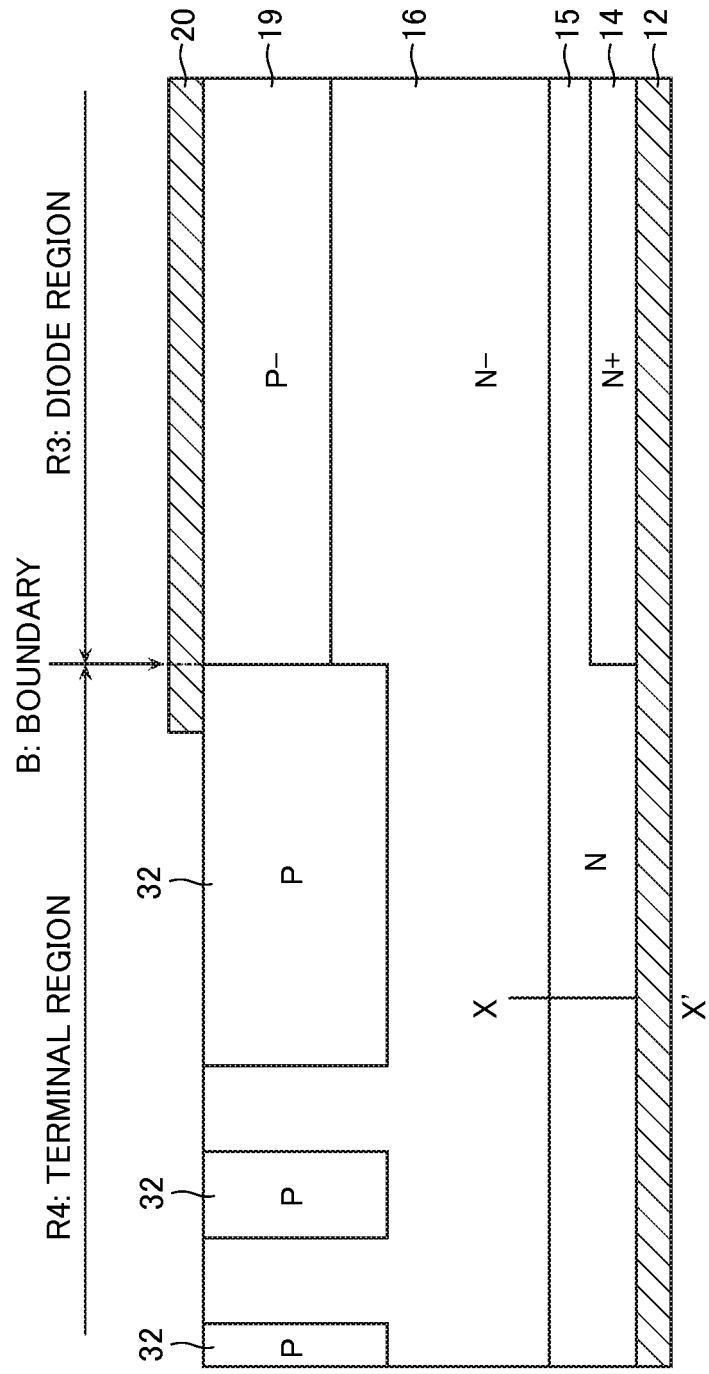
FIG. 25 is the B-B' cross-sectional view in FIG. 1 illustrating a semiconductor device according to a twenty-third embodiment.
Figure 26:
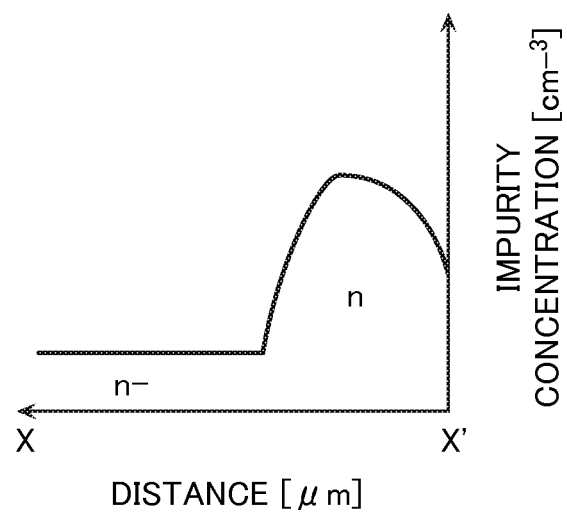
FIG. 26 is a graph of the impurity profile of the semiconductor device according to the twenty-third embodiment.

Referring now to FIG. 25 and FIG. 26, semiconductor device according to a Twenty-third embodiment will be described. In FIG. 25, like elements as those in the above embodiments are designated with like reference numerals and their description is omitted.

In this embodiment, the N+ type cathode layer 14 in the diode region R3 extends to the boundary B between the diode region R3 and the terminal region R4. In addition, the P type diffusion layer 32, which functions as the guard ring layer, is formed on the anode electrode 20 side of the terminal region. In addition, the anode electrode 20 is in electrical contact with the P type diffusion layer 32.

Note, however, that in this embodiment, the impurity concentration profile of the N type buffer layer 15 is not uniform in a direction perpendicular to the substrate and has a distribution curve (in the X-X' direction) as shown in FIG. 26. Specifically, the N type buffer layer 15 has a low impurity concentration ($cm^{-3}$) in the surface on the drift layer 16 side, while the buffer layer 15 has a peak value of the impurity concentration inside thereof. The impurity concentration on the back surface is set to a low value that allows formation of the Schottky junction between the buffer layer 15 and the common electrode 12. The formation of the Schottky junction forms a high barrier that facilitates the hole discharge, reduces the electron injection, and reduces the operation of the terminal region R4 as the high injection diode. This may maintain the characteristics of the diode region R3. Note that such an impurity concentration profile may be achieved by adjusting the accelerating voltage of the ion implantation system. After the implantation, the impurity needs to be activated by laser annealing or the like.

The impurity dose of the N type buffer layer 15 is set to a small value in the surface of the drift layer 16 side. This may reduce the formation of the high injection parasitic diode around the boundary B, thereby reducing the on-voltage and the switching time without reducing the safe operation area at turn-off.

A low impurity dose of the entire N type buffer layer 15 increases the possibility that a punch through is occurred when the reverse bias is applied. Therefore, in this embodiment, the peak of the impurity concentration is positioned inside the buffer layer 15 so that a high impurity dose may be achieved while keeping a low surface concentration that allows the formation of the Schottky junction between the buffer layer 15 and the common electrode 12. By way of example, it is preferable that the peak is positioned nearer to the surface of the common electrode 12 than to the surface of the N+ type cathode layer 14.

Others

Some embodiments of the present invention have been described, but these embodiments are shown only as examples and are not intended to limit the scope of the invention. These new embodiments may be implemented in various other forms, and subjected to various omissions, replacements, and modifications without departing from the spirit of the present invention. These embodiments and variants thereof are within the scope and sprit of the invention, and are also within the scope of the invention as defined in the appended claims and the equivalent thereof. For example, in the above all embodiments, the present invention is also applicable to a semiconductor device in which the p type and n type are interchanged.

In addition, although the above fourth to twenty-third embodiments illustratively show the structures of the diode region R3 and the terminal region R4 in the RC-IGBT, it should be understood that the present invention is not limited thereto and is also applicable to the structures of the diode region and the terminal region of a semiconductor device having one diode.

In addition, although the fourth to twenty-third embodiments illustratively show the anode structure in the diode region R3, it should be understood that the present invention is not limited thereto and may be subjected to various replacements, additions, deletions, and the like without departing from the spirit of the present invention, such as a configuration having the anode region in the trench or the like.

What is claimed is:

1. A semiconductor device, comprising:
   an first region provided on an electrode;
   a second region provided on the electrode;
   a first layer of a first conductivity type in the first region, the first layer being provided on a first surface side of the electrode,
   a second layer of a second conductivity type in the second region apart from the first layer, the second layer being provided on the first surface side of the electrode;
   a third layer of the second conductivity type in the first region and the second region, the third layer being provided on sides of the first layer and the second layer opposite the electrode;
   a fourth layer of the first conductivity type in the first region, the fourth layer being provided on a side of the third layer opposite the electrode;
   a fifth layer of the first conductivity type provided between the first region and the second region, the fifth layer being provided on a side of the third layer opposite the electrode, the fifth layer having a first depth larger than a second depth of the fourth layer; and
   a sixth layer of the second conductivity type provided on the electrode, the sixth layer being provided between the first layer and the second layer.

2. The semiconductor device according to claim 1, wherein the second cathode layer is disposed at a predetermined pitch in a first direction parallel to the electrode.

3. The semiconductor device according to claim 1, further comprising:
   a seventh layer in the second region, the seventh layer being provided on a side of the third layer opposite the electrode; and
   a conductive electrode that is provided in the seventh layer and the third layer through an insulating film.

4. The semiconductor device according to claim 3, wherein the seventh layer is an anode layer.

5. The semiconductor device according to claim 1, wherein the second layer is provided apart from the fifth layer, and the first layer has its end portion under the fifth layer.

6. The semiconductor device according to claim 1, wherein the first layer is a collector layer.

7. The semiconductor device according to claim 1, wherein the second layer is a cathode layer.

8. The semiconductor device according to claim 1, wherein the third layer is a drift layer.

9. The semiconductor device according to claim 1, wherein the first region is configured to an IGBT.

10. The semiconductor device according to claim 1, wherein the second region is configured to a diode.

* * * * *